(12) United States Patent
Kobayashi et al.

(10) Patent No.: US 6,238,943 B1
(45) Date of Patent: May 29, 2001

(54) OPTICAL SEMICONDUCTOR DEVICE AND A METHOD OF MANUFACTURING THE SAME

(75) Inventors: Hirohiko Kobayashi; Mitsuru Ekawa; Nirou Okazaki; Shouichi Ogita; Haruhisa Soda; Haruhiko Tabuchi; Takuya Fujii, all of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/401,784

(22) Filed: Sep. 22, 1999

Related U.S. Application Data

(62) Division of application No. 08/826,533, filed on Apr. 2, 1997, now Pat. No. 5,987,046, which is a continuation of application No. 08/297,836, filed on Aug. 30, 1994, now abandoned.

(30) Foreign Application Priority Data

Aug. 31, 1993 (JP) ................................... 5-216006
Feb. 15, 1994 (JP) ................................... 6-18721
Jul. 18, 1994 (JP) ................................... 6-165145

(51) Int. Cl.[7] .................................. H01L 21/00
(52) U.S. Cl. .................. 438/31; 438/22; 438/32; 438/40; 438/42; 438/681; 438/942; 372/45; 372/46; 372/50
(58) Field of Search ................. 438/22–31, 32, 438/40, 41, 681, 942; 372/46, 45, 50

(56) References Cited

U.S. PATENT DOCUMENTS

| | | |
|---|---|---|
| 4,961,198 | 10/1990 | Ishino . |
| 5,048,907 | 9/1991 | Wickman et al. ............... 385/130 |
| 5,153,935 | 10/1992 | Mueller ........................... 385/50 |
| 5,323,476 | 6/1994 | Mueller et al. ................. 385/50 |
| 5,327,445 | 7/1994 | Matsumoto et al. . |
| 5,910,012 | * 6/1999 | Takeuchi ........................... 438/31 |
| 6,052,397 | * 4/2000 | Jeon et al. . |

FOREIGN PATENT DOCUMENTS

| | | |
|---|---|---|
| 0081956 | 6/1982 | (EP) . |
| 0472221 | 2/1992 | (EP) . |
| 0495202 | 7/1992 | (EP) . |
| 63-233584 | 8/1988 | (JP) . |
| 1-53487 | 3/1989 | (JP) . |
| 1-73689 | 3/1989 | (JP) . |
| 1-129478 | 5/1989 | (JP) . |
| 1-319986 | 12/1989 | (JP) . |
| 1-321677 | 12/1989 | (JP) . |
| 3-284891 | 12/1991 | (JP) . |
| 5-249331 | 9/1993 | (JP) . |
| H5-327111 | 12/1993 | (JP) . |
| 7-131108 | 5/1995 | (JP) . |

OTHER PUBLICATIONS

T. Brenner, et al., "Compact InGaAsP/InP Laser Diodes . . . Singlemode Fibres", Electronic Letters, Aug. 17, 1995, vol. 31, No. 17.*

T. Brenner, et al., "Integrated Optical Modeshape . . . wave–guide Coupling", IEEE Photonics Tech. Letters, vol. 5, No. 9, Sep. 1993.*

T. Brenner, et al., "Vertically Tapered InGaAsP/InP . . . Singlemode Fibers", Appl. Phys. Lett. 65(7), Aug. 15, 1994.*

T.L. Koch, "Tapered Waveguide InGaAs/InGaAsP Multiple–Quantum–Well Lasers", IEEE Photonics Technology Letter, vol. 2, No. 2, Feb. 1990.

(List continued on next page.)

Primary Examiner—Long Pham
(74) Attorney, Agent, or Firm—Armstrong, Westerman, Hattori, McLeland & Naughton, LLP

(57) ABSTRACT

An optical semiconductor device of the present invention is provided with a core layer having a quantum well layer in that film thickness gets thinner from a inner region to an end portion in an optical waveguide region.

8 Claims, 36 Drawing Sheets-

OTHER PUBLICATIONS

The Institute of Electronics Information Communication in Japan, National Autumn Meeting 1993, No. C–182.

Kazuo Kasaya et al, NTT Opto–Electronics Laboritories, The Institute of Electronic Information Communications in Japan, National Autumn Meeting 1993.

The Institute of Electronic Information Communication in Japan, national Autumn Meeting 1992, Lecture No. C–201.

The Institute of Electronic Information Communication in Japan, national Autumn Meeting 1992, Lecture No. C–202.

IEEE Photonics Technology Letters, vol. 5, No. 4, Apr. 1993, New York US, pp. 448–450.

T.M. Cockerill et al 'Monolithic integration of a strained layer InGaAs–GaAs–AlGaAs quantum well laser with a passive waveguide by selective area MOCVD' entire document.

EP–A–0 495 202 (Siemens), entire document.

EP–A–0 472 221 (Nec Corp), entire document.

IEEE Journal of Quantum Electronics, vol. 29, No. 6, Jun. 1993, New York, US, pp. 2088–2096.

M. Aoki et al 'InGaAs/InGaAsP MQW electroabsorption modulator integrated with a DFB laser fabricated by Band–gap energy control selective area MOCVD' paragraph I; figure 8.

EP–A–0 081 956 (Xerox), entire document.

* cited by examiner

FIG.IB
PRIOR ART
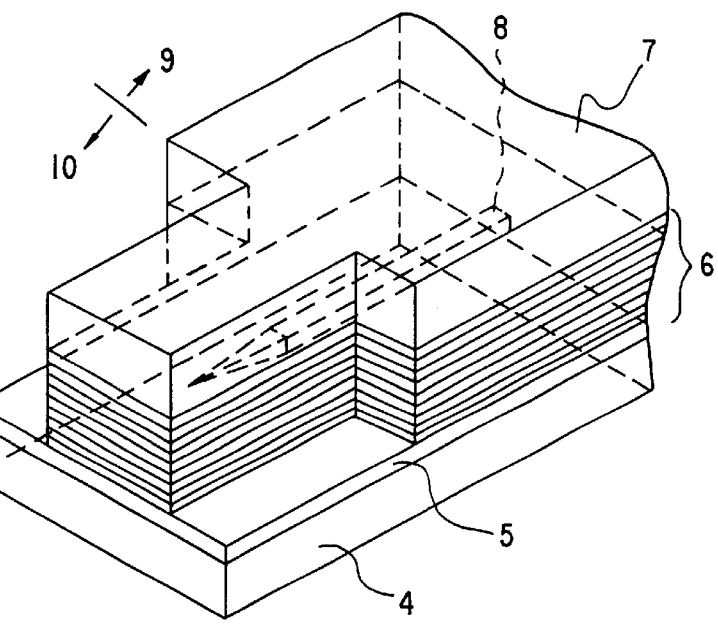
FIG.IC
PRIOR ART
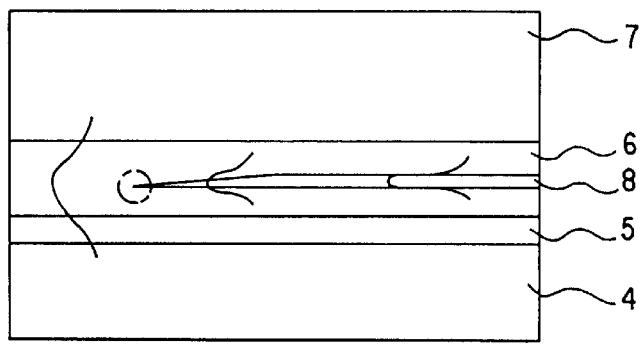
FIG.ID
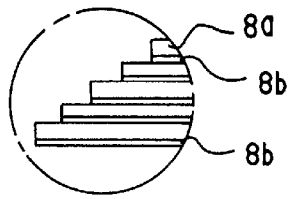

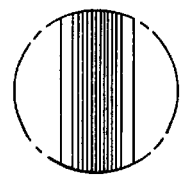
FIG.6A
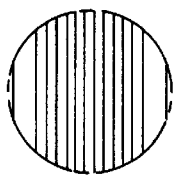
FIG.6B
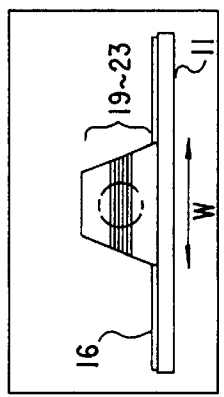
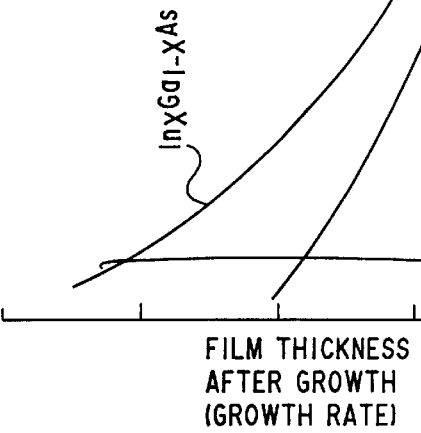
FIG.6

FIG. 14
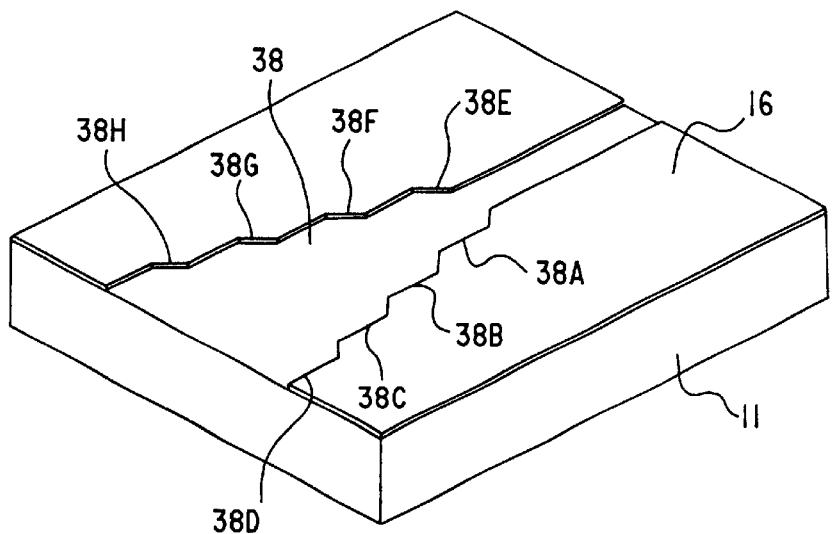
FIG.15A  FIG.15B  FIG.15C
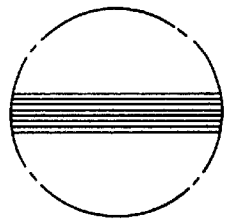 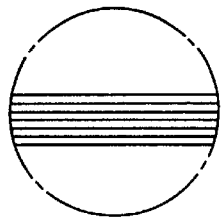 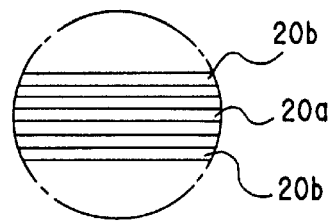
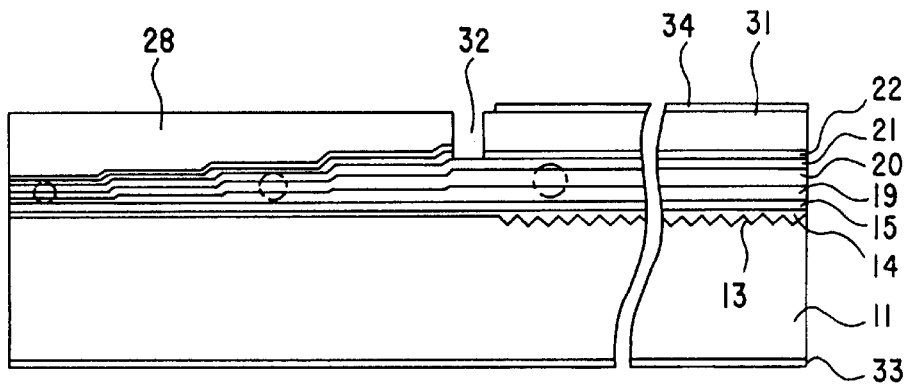
FIG.15

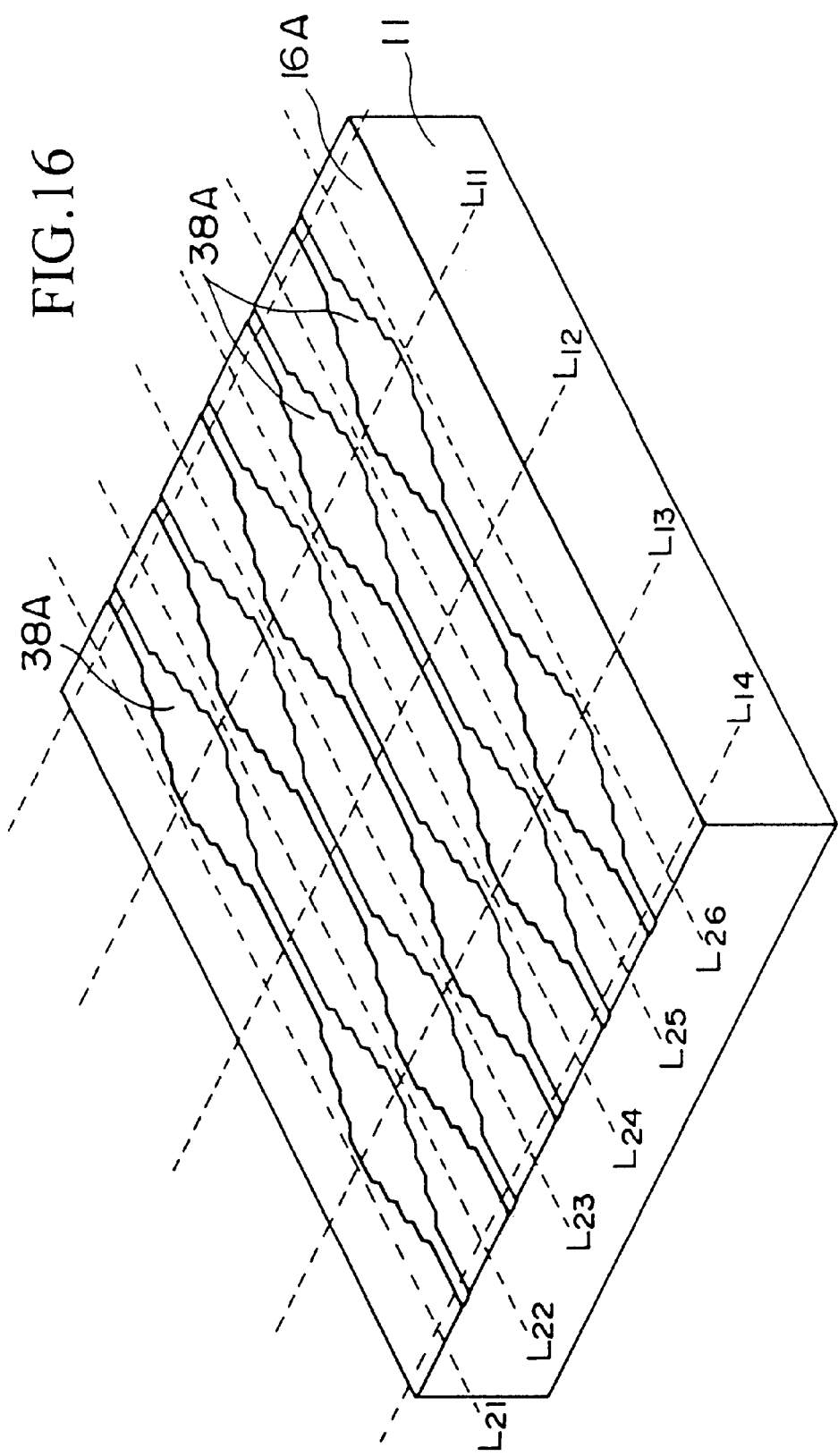

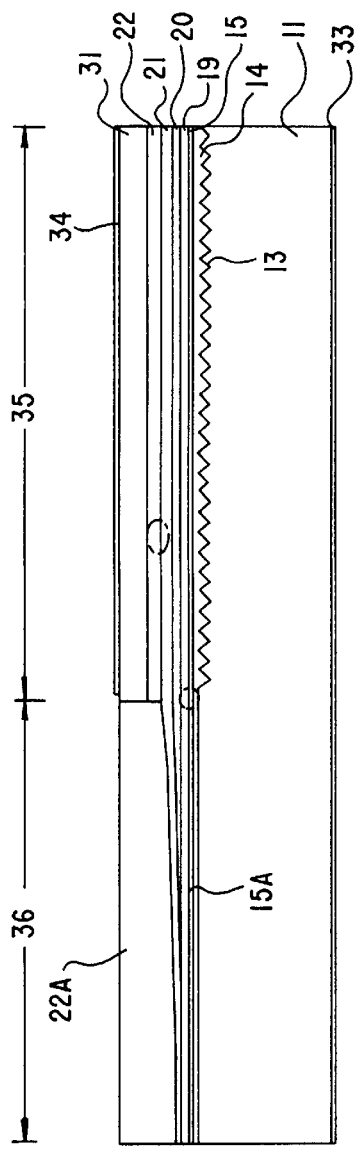
FIG. 20
FIG. 20A
FIG. 20B
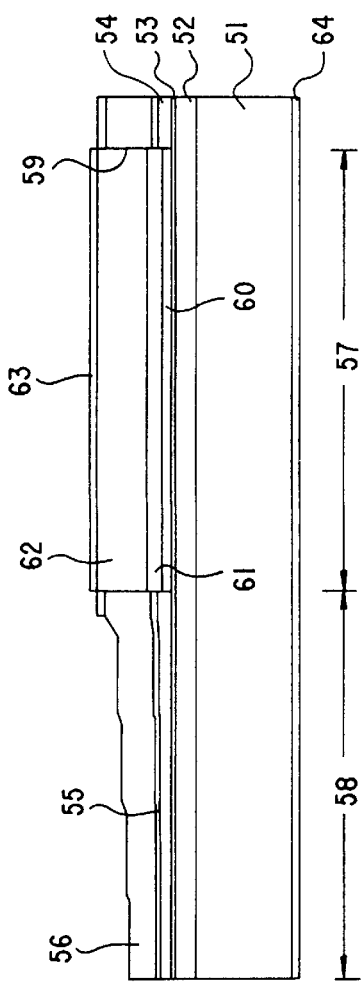
FIG. 21

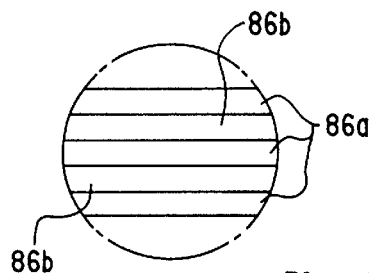
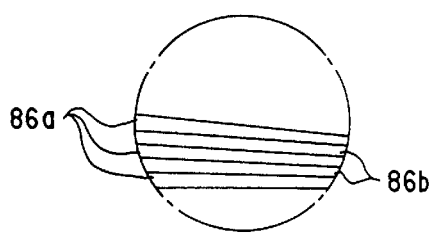
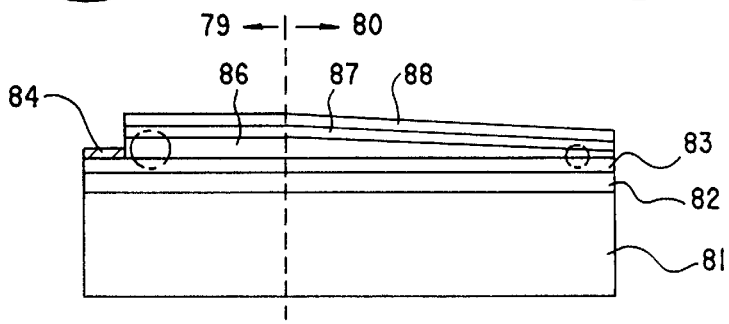
FIG.26A
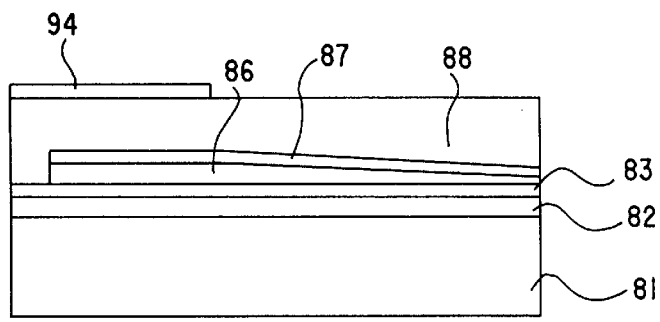
FIG.26B
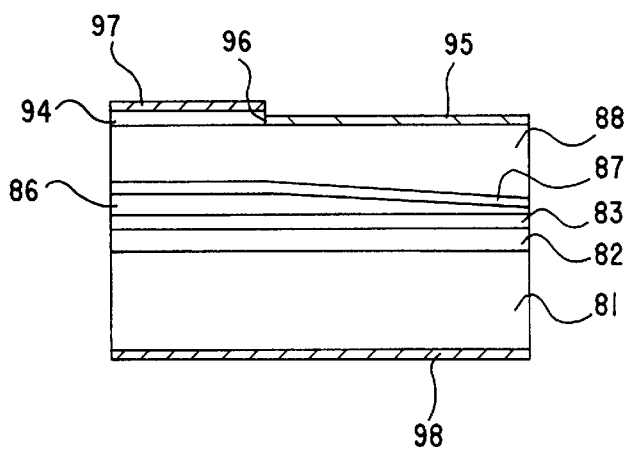
FIG.26C

FIG.27A-1
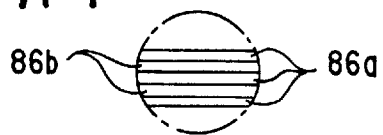
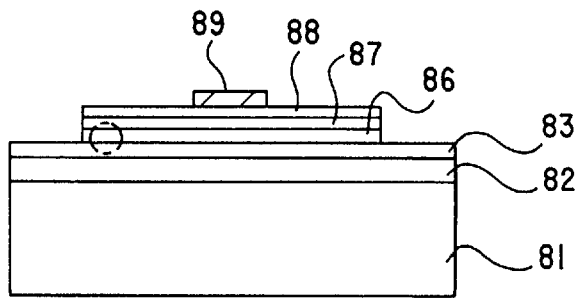
FIG.27A
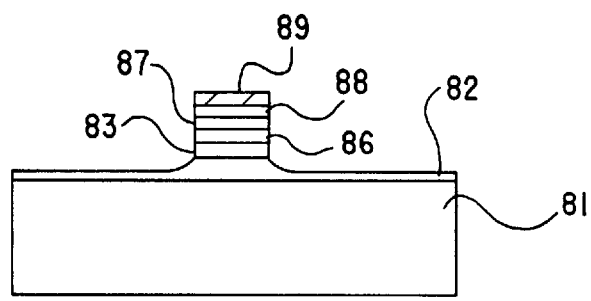
FIG.27B
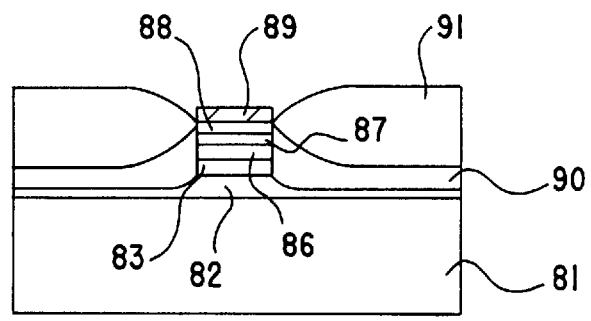
FIG.27C

FIG.30
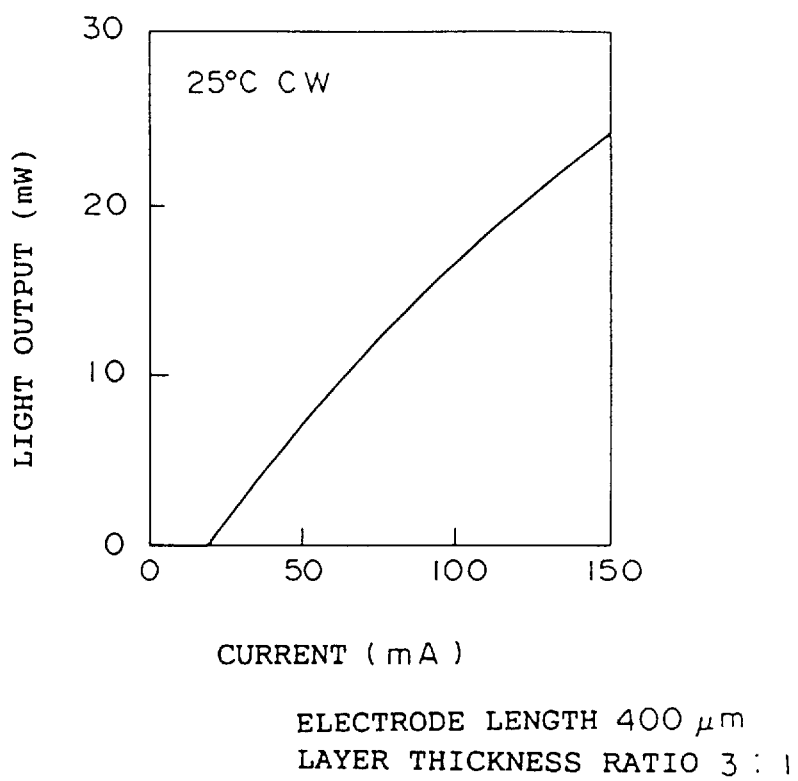
ELECTRODE LENGTH 400 μm
LAYER THICKNESS RATIO 3 : 1
FIG.31A     FIG.31B
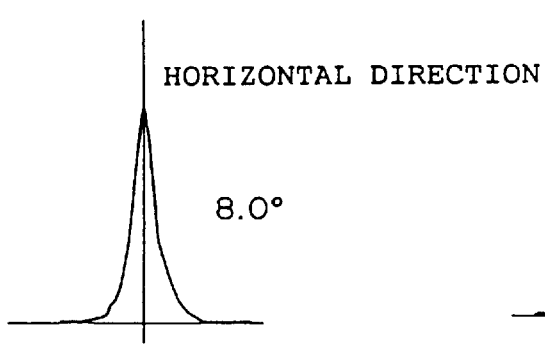
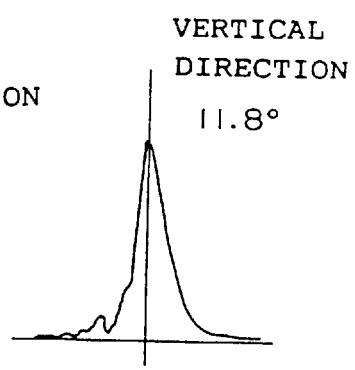

OPTICAL SEMICONDUCTOR DEVICE AND A METHOD OF MANUFACTURING THE SAME

This application is a division of prior application Ser. No. 08/826,533 filed Apr. 2, 1997 U.S. Pat. No. 5,987,046, which is a continuation of Ser. No. 08/297,836, filed Aug. 30, 1994 now abandoned.

BACKGROUND OF THE INVENTION

1. Field of the Invention

The present invention relates to an optical semiconductor device and a method of manufacturing the same and more particularly to an optical semiconductor device having a high output semiconductor laser used for a light source of an information processing unit such as an optical printer and an optical disk unit, a semiconductor laser amplifier used for light amplification, an optical active element such as a semiconductor laser used in a transmitter of an optical communication apparatus or a photodiode used in a receiver thereof and an optical waveguide, and a method of manufacturing the same.

2. Description of the Prior Art

With the advance of semiconductor communication technique, the production technique of a semiconductor laser is also improved, and researches in integration of a semiconductor laser with another optical semiconductor element are being made extensively in recent years. For example, an apparatus in which a DFB (distributed feedback) laser and a light modulator are integrated and an apparatus in which a DBR (distributed Bragg reflector) laser and a mode transducer (a beam size converter) are integrated are available.

A mode transducer is a mechanism for narrowing an output beam of a semiconductor laser originally having an output angle as wide as 30 to 40 degrees, and for facilitating optical coupling in case a semiconductor laser and an optical fiber are formed into a module.

In a semiconductor laser, the more intense the optical confinement of an optical waveguide is, i.e., the smaller a light spot diameter is, the smaller an oscillation threshold becomes, and a luminous efficiency is improved. As the light spot diameter gets smaller, however, coupling with the optical fiber becomes more difficult.

Further, a semiconductor laser requiring a high output such as a laser for exciting a fiber type optical amplifier using an optical fiber doped with erbium or a semiconductor laser for writing information in a optical disk has such a problem that an optical power density rises at a laser end face and damage of the end face is liable to be produced. Furthermore, a semiconductor laser amplifier has such a drawback that the optical output is saturated easily when beam confinement is intense.

Those photodiodes that have a rapid speed of response and a high quantum efficiency are required, and furthermore, those that can be formed into a thin shape and in that electrical wiring is easy are demanded.

An end face incidence waveguide type photodiode is available as a photodiode which meets such a requirement. In this waveguide type photodiode, the more intense the beam confinement is, the shorter the waveguide is made. With this, internal pn junction capacity thereof is reduced, thus making high-speed response possible. Moreover, reactive components of light absorption such as free carrier absorption of a cladding layer and the quantum efficiency is increased, thus improving sensitivity.

Under such circumstances, a semiconductor laser, a semiconductor laser amplifier and a photodiode having an optical waveguide in which beam confinement is intense inside and beam confinement is weak at an end face are demanded in the fields of optical communication and optical information processing.

So, a waveguide for converting an optical beam diameter composed of a semiconductor has been proposed as shown in FIG. 1A to FIG. 1C. The semiconductor waveguide shown in FIG. 1A is disclosed in [1] the Institute of Electronic Information Communications in Japan, National Autumn Meeting 1992, Lecture Number C-201 for example. The semiconductor waveguide shown in FIGS. 1B and 1C has been proposed in [2] the Institute of Electronic Information Communications in Japan, National Autumn Meeting 1992, Lecture Number C-202 for instance. In [3] T. L. KOCH et al., IEEE PHOTONICS TECHNOLOGY LETTERS, VOL. 2, NO. 2, 1990, the semiconductor waveguide is proposed in a mode transducer integrated Fabry-Perot semiconductor laser (hereinafter referred to also as an FP-LD) having a waveguide for converting an optical beam system.

An optical beam diameter converting waveguide shown in FIG. 1A has an InGaAsP core layer 3 surrounded by an InP substrate 1 and an InP cladding layer 2 at top and bottom and left and right.

The lateral width of the InGaAsP core layer 3 is wide at one end face and gets narrower as getting near another end face, and the optical beam diameter spreads in a lateral direction on the side where the width is narrowed in accordance with the variation of the width. The thickness of the InGaAsP core layer 3 is uniform, and the plane pattern thereof is formed by lithography technique using an exposure mask.

Thus, the semiconductor waveguide is effective for converting an optical beam diameter in a lateral direction, but the optical beam diameter in a longitudinal direction (a thickness direction of the layer) is not converted.

Now, in an optical waveguide using a semiconductor, since the optical beam diameter in the thickness direction of the core layer is generally smaller than that in the width direction thereof, conversion of the optical beam diameter in the longitudinal direction is important for the improvement of the optical coupling efficiency with an optical fiber, an optical semiconductor element or the like. Since the optical beam diameter in the thickness direction of the layer is not converted in the semiconductor waveguide for converting the optical beam diameter shown in FIG. 1, a significant effect cannot be expected for the improvement of the optical coupling efficiency between the semiconductor optical waveguide and an optical fiber or the like.

In order to increase the coupling efficiency, it is conceivable to form the semiconductor waveguide for converting the optical beam diameter thereof and the waveguide-shaped photodiode into an integral construction. Since the thickness and the composition of these core layers become uniform in the optical axis direction, however, the end face of the semiconductor waveguide also becomes a light absorption region and the optical loss is increased. Furthermore, since a PN junction is exposed at the end face, a dark current is increased. When the dark current is more or less increased, there is a problem that a signal-to-noise ratio is deteriorated in case very high sensitivity is required.

As against the above, the semiconductor wave-guide for converting the optical beam diameter shown in FIGS. 1A and 1B has a construction that the optical beam diameter is converted in the thickness direction of the film.

This semiconductor waveguide has a first InP cladding layer 5 laminated on an InP substrate 4, a multi-quantum well (MQW) layer 6 composed of an InP well and an InAgAs barrier formed thereon and a second InP cladding layer 7 formed on the MQW layer 6. Further, an InGaAsP core layer 8 is formed in the MQW layer 6, and the film thickness at one end thereof is thinned in the MQW layer 6. Besides, the MQW layer 6 serves as a cladding layer for the core layer 8 and as a core layer for the first and the second InP cladding layers 5 and 7. The core layer 8 is formed both in a gain region 9 and a mode conversion region 10. Further, the core layer 8 in the mode conversion region 10 is formed in a tapered shape in the thickness direction, and gets thinner as becoming more distant from the gain region 9.

The light advancing in such a semiconductor waveguide is confined in the MQW layer 6 and further confined more intensely in the cladding layer 7. The optical beam diameter is converted at a portion where the film thickness of the core layer 8 is changed. Further, since the light excited in the MQW layer 6 is confined more weakly in the mode conversion region 10 than in the gain region 9, a near field pattern at a taper bottom end portion is spread. As a result, a far field pattern which is a diffracted pattern of the near field pattern is contracted. Accordingly, an output angle of a beam emitted from the taper bottom end is narrowed, which makes coupling with an optical fiber easier. Three cone-shaped patterns in FIG. 1C show intensity distribution of a photoelectric field.

Now, the core layer 8 shown in FIG. 1C has a structure in which an InGaAsP layer 8a and an InP layer 8b are laminated alternately as shown in an enlarged view led out with a dashed line, and the InGaAsP layers 8a and 8b are applied with patterning stepwise using the InP layer 8b as an etching stop layer, thus varying the film thickness of the core layer 8 stepwise.

Since it means that patterning is repeated many times to vary the film thickness of the core layer 8 by such a method, the throughput is lowered.

When such a semiconductor waveguide is integrated in a monolithic manner with a light emitting element, active layers of the core layer 8 and the light emitting element become the same. Therefore, a defect is liable to be produced in the crystal of the active layer of the light emitting element in processing for varying the film thickness of the core layer 8, thus causing a fear that the characteristics of the light emitting element are deteriorated. Further, when the semiconductor waveguide and the light receiving element are integrated in a monolithic manner, a defect is also liable to be produced in the absorption layer of the light receiving element, thus also causing a fear that the characteristics of the light receiving element are deteriorated.

The FP-LD described in the above-mentioned citation [3] is structured by forming a first InP cladding layer 102, a waveguide layer 103, a multiple quantum well (MQW) active layer 104 and a second InP cladding layer 105 one upon another on an InP substrate 101 as shown in FIG. 2. The MQW active layer 104 is structured of an InGaAs well layer and an InGaAsP barrier layer, and is formed only in a gain region 110. Further, the waveguide layer 103 is formed in both of the gain region 110 and a mode conversion region 111. Besides, a reference numeral 106 represents a contact layer formed on the second InP cladding layer 105, and 107 represents an etching stop layer formed in the second cladding layer.

The waveguide layer 103 in the mode conversion a region 111 is formed in a tapered form in the thickness direction, and gets thinner as becoming more distant from the gain region 110. The waveguide layer 103 has such a structure that an InGaAsP layer 103a and an InP layer 103b are laminated alternately. Further, the InP layer 103b is used as an etching stop layer, and the InGaAsP layer 103a and the InP layer 103b are applied with patterning to form a step form while changing the etching proof mask in a plurality of times, thus forming the film thickness of the waveguide layer 103 in the mode conversion region in a tapered form.

As to the light excited in the MQW active layer 104 and conducting through the waveguide layer 3, the near field pattern thereof at the taper bottom end portion spreads since optical confinement is weaker in the mode conversion region 111 than that in the gain region 110, thus resulting in that the far field pattern that is a diffracted pattern of the near field pattern is narrowed. Accordingly, the output angle of a beam emitted from the taper bottom end, thus making coupling with an optical fiber easier.

Besides, in the light intensity-current characteristic in the provisional publication [4], only the threshold current of 42 Ma and the differential quantum efficiency of 0.15 mW/Ma are obtained.

Now, the waveguide layer 103 forming a resonator has such a construction that the number of layers becomes less as getting near the output end, and the tapered form of the waveguide layer 103 is obtainable by changing the etching-proof mask in a plurality of times. Therefore, the construction is liable to include a crystal defect and deterioration of characteristics of a light emitting element is liable to be produced.

Further, what is important when a tapered waveguide layer is integrated in a semiconductor laser is to arrange so that the waveguide located in the mode conversion region does not act as an absorbing medium for an oscillation light.

Since the active layer 104 in the gain region 110 and the tapered waveguide layer 103 in the mode conversion region 111 are different layers and formed of almost the same composition in the construction described in the above-mentioned citation [3], a part of the laser light is liable to be absorbed in the portion near the gain region 110 of the tapered waveguide layer 103. Accordingly, lowering of an optical output and a slope efficiency (a differential value of a leading edge of a current to light intensity characteristic curve) is unavoidable as compared with a laser element in which the mode converter is not integrated. In particular, since the tapered waveguide is located in a resonator in the FP-LD described in the citation [3], influence is exerted even on a fundamental characteristic of the semiconductor laser, and a threshold current in pulse measurement rises up to 70 mA in an element of double end cleavage. Moreover, no report has been made that continuous oscillation has occurred at room temperature in an element of double end cleavage.

Further, an apparatus in which a semiconductor laser and a tapered waveguide are integrated has been disclosed in [4] Japanese Patent Provisional Publication No. SHO63-233584 and [5] Japanese Patent Provisional Publication No. SHO64-53487. In the constructions thereof, the laser active layer and the tapered waveguide are also formed of the same composition, and the absorption loss in the taper region is great. In order to deny the absorption loss, it is required to inject a large current into the whole tapered waveguide, too.

In the light intensity-current characteristic in the provisional publication [4], only the threshold current of 42 mA and the differential quantum efficiency of 0.15 mW/mA were obtained as it is apparent from the description. Further, since the tapered form of the waveguide layer is obtained by devising the etching method, it becomes difficult to form the tapered form always uniformly, thus generating a fear that the yield is lowered in addition to poor controllability of the beam spot configuration. Moreover, a crystal defect is liable to be produced in the waveguide layer forming the resonator and deterioration of characteristics of a light emitting element is liable to be generated. Furthermore, the waveguide layer is composed of a single material, and has not an MQW layer in a tapered form such as described in the citation [3].

Besides, an optical semiconductor device having a tapered form in a lateral direction is described in the provisional publication [3], and processing in submicron order is required at the bottom end portion of the tapered waveguide. Hence, it is difficult to produce the same tapered form with good reproducibility because of the structure thereof.

SUMMARY OF THE INVENTION

It is an object of the present invention to provide an optical semiconductor device in which an optical active-element such as a semiconductor laser, a light emitting diode and a photodiode and an optical waveguide are formed in a monolithic manner, and diameters of an optical beam in a width direction and a thickness direction of a core layer at an end face of the optical waveguide can be made larger and a method of manufacturing the same.

Furthermore, it is an object of another invention to provide an optical semiconductor device with a mode converter capable of reducing optical absorption in a waveguide and performing stable laser oscillation at a low threshold.

According to the present invention, a core layer of an optical waveguide is formed in contact with at least one of a light input portion and a light output portion of an optical active element, and it is also arranged so that the film thickness of the core layer gets thinner as becoming more distant from the optical active element and or the width of the core layer gets wider as becoming more distant from the optical active element.

Thus, when the light is outputted from the optical active element, a mode of the light expands in the width direction through the core layer of the optical waveguide, and optical confinement gets weaker in the thickness direction of the core layer as going toward the end portion. Thus, the optical beam diameter gets larger. Further, when the light inputs to the input end of the optical waveguide on the contrary, optical confinement becomes more intense as going toward the optical active device, and the optical beam diameter gets smaller, thereby to reach the optical active element.

As a result, the efficiency of optical coupling between the optical active element and the optical fiber is improved by going through the optical waveguide. Moreover, since the optical waveguide and the optical active element are formed as one body, positioning from the outside becomes unnecessary and so the optical coupling loss is reduced.

Further, an energy band gap of the core layer of the optical waveguide is arranged to get larger as becoming more distant from the optical active element. Therefore, when the optical active element is a semiconductor laser or a semiconductor laser amplifier, the light having a laser-oscillated wavelength is hard to be absorbed by the optical waveguide and so the absorption loss in the optical semiconductor device is reduced.

Furthermore, since the difference of refractive indices between the core layer and the cladding layer of the waveguide is made smaller as becoming more distant from the optical active element, the optical beam diameter becomes larger at a distant position from the optical active element and becomes smaller at a near position therefrom. As a result, the coupling efficiency between the optical active element and the optical fiber is further improved by having that optical waveguide lie therebetween.

Now, when the cladding layer of the optical waveguide is formed with a non-doped semiconductor, light absorption by free carriers is reduced, thus controlling attenuation of light intensity. Further, when the optical waveguide and the cladding layer of the optical active element are separated from each other by a groove, the parasitic capacity of the optical active element is reduced.

Besides, even when the width of the core layer is fixed, optical confinement not only in a direction perpendicular to the junction, but also in a direction parallel to the junction also becomes weaker as the core layer gets thinner. Therefore, although the degree of the effect is comparatively low, a similar effect is obtainable.

According to another invention, an active layer in the gain region and a waveguide for mode conversion are structured of one quantum well construction layer in a stripe form, and the quantum well construction layer of the waveguide is made thinner as becoming more distant from the gain region without changing the number of layers, thus converting the diameter of the optical beam.

Further, as to the thickness of the quantum well construction layer in the mode conversion region, the film thickness at the input end in the input mode conversion region is two times or more as compared with the film thickness at the output end. According to the foregoing, the shape of the beam spot released from the quantum well construction layer becomes a circle or a shape very close to a circle, and moreover, the beam output angle thereof falls within the range from 20 degrees to 10 degrees. Hence, the coupling efficiency with an optical fiber or the like is improved by a large margin.

Furthermore, in this construction, the quantum well layer forming the waveguide for mode conversion is thinner than the thickness of the quantum well layer forming the active layer and a ground level of the quantum well is higher in the waveguide for mode conversion than that in the active layer. Thus, a light absorption wavelength edge in the waveguide for mode conversion at the output end portion shows a shorter wavelength than the oscillation wavelength in the active layer. With this, the light conducted in the quantum well construction layer at the output end portion is not absorbed in the mode conversion region.

Further, a circular beam spot is formed by setting the ratio of minimum values of both end widths of a stripe-shaped quantum well construction layer to 0.8 to 1.2, thus making optical coupling with an optical fiber or the like easier.

Now, since the film thickness of the quantum well construction layer gets thinner gradually from the end portion of the gain region to the light output end of the waveguide for mode conversion, there is a fear that reduction of the film thickness of the waveguide for mode conversion is insufficient in the vicinity of the gain region, thus inflicting a serious loss.

According to another invention, however, since a current is applied locally by providing an electrode or extending the contact layer in a portion near the gain region in the waveguide for mode conversion, that portion surely becomes transparent and light absorption disappears. With this, it is possible to reduce the light absorption in the waveguide for mode conversion, thus performing stable laser oscillation at a low threshold.

The electrode formed in a portion near the gain region in the waveguide for mode conversion may be obtained either by extending the electrode in the gain region or by separating from the electrode in the gain region, but it becomes easier to control the light absorption quantity by separation.

BRIEF DESCRIPTION OF THE DRAWINGS

FIG. 1B and FIG. 1C are a perspective view and a sectional view showing a second example of a conventional optical beam diameter conversion waveguide;

FIG. 1D is an enlarged view of the chain line in FIG. 1C;

FIG. 3B–1 is an enlarged view of the chain line in FIG. 3B;

FIG. 6 is a diagram showing, in the manufacturing process of the first optical semiconductor device according to an embodiment of the present invention, the relationship between the size of window width of a mask pattern and the growth speed of the semiconductor in the window;

FIG. 6A is an enlarged cross-section of size W, of window width in FIG. 6;

FIG. 6B is an enlarged cross-section of size W2 of window width in FIG. 6;

FIG. 14 is a perspective view showing a mask used in forming a second optical semiconductor device of an embodiment of the present invention;

FIG. 15 is a sectional view showing the second optical semiconductor device of an embodiment of the present invention;

FIG. 15A is an enlarged view of a left chain line in FIG. 15.

FIG. 15B is an enlarged view of a center chain in FIG. 15.

FIG. 15C is an enlarged view of a right chain line in FIG. 15.

FIG. 16 is a perspective view showing a mask used in mass production of optical semiconductor devices according to an embodiment of the present invention;

FIG. 20 is a sectional view showing a fourth optical semiconductor device according to an embodiment of the present invention;

FIG. 20A is an enlarged view of a left chain line in FIG. 20.

FIG. 20B is an enlarged view of a right chain line in FIG. 20.

FIG. 21 is a sectional view showing a fifth optical semiconductor device according to an embodiment of the present invention;

FIG. 26A to FIG. 26C are side sectional views each showing a part of the manufacturing process of the seventh optical semiconductor device according to an embodiment of the present invention;

FIG. 26A–1 is an enlarged view of a left chain line in FIG. 26A.

FIG. 26A–2 is an enlarged view of a right chain line in FIG. 26A.

FIG. 27A to FIG. 27C are front sectional views each showing a part of the manufacturing process of the seventh optical semiconductor device according to an embodiment of the present invention;

FIG. 27A–1 is an enlarged view of a chain line in FIG. 27A.

FIG. 30 is a characteristic diagram showing the relationship between the current and the optical output in the seventh optical semiconductor device according to an embodiment of the present invention;

FIG. 31A and FIG. 31B are light intensity distribution diagrams in a horizontal direction and a vertical direction of a far field pattern of the seventh optical semiconductor device according to an embodiment of the present invention;

DESCRIPTION OF THE PREFERRED EMBODIMENTS

The First Embodiment

Figure 1A:
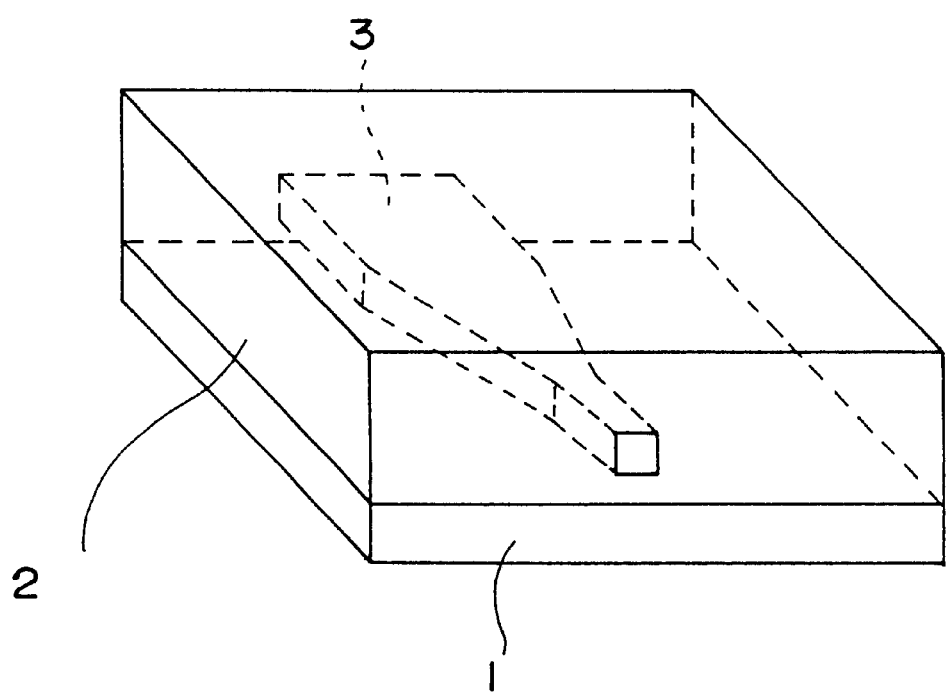
FIG. 1A is a perspective view showing a first example of a conventional optical beam diameter conversion waveguide.
Figure 2:
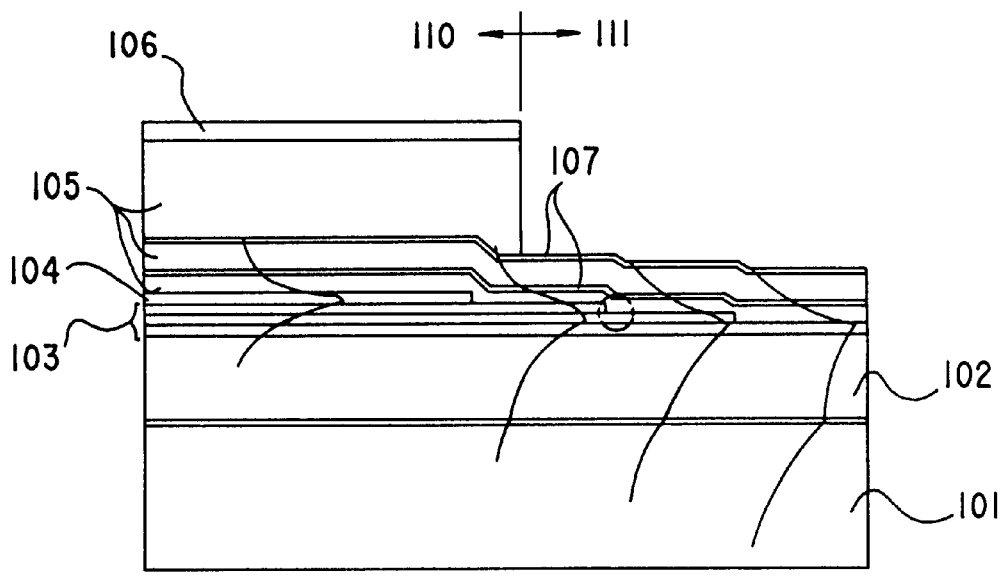
FIG. 2 is a sectional view showing a conventional mode converter integrated Fabry-Pérot type semiconductor laser.
Figure 2A:
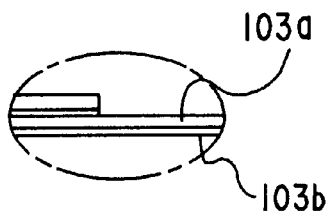
FIG. 2A is an enlarged view of the chain line in FIG. 2.
Figure 3A:
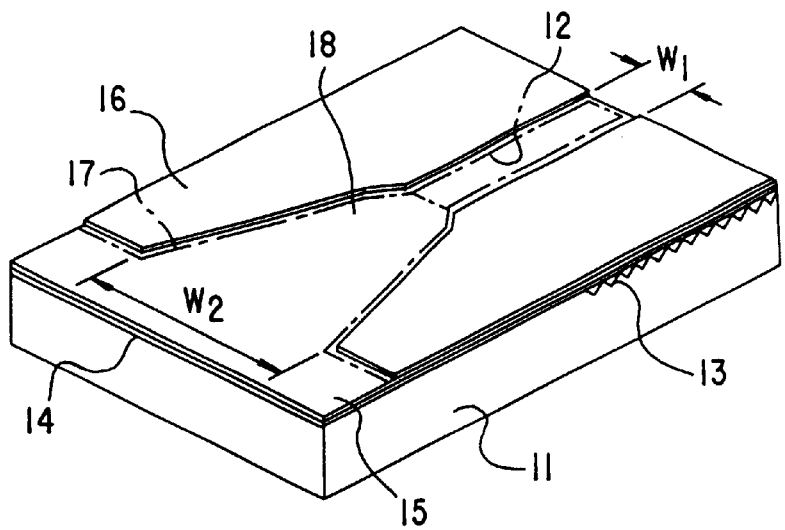
FIGS. 3A to 3K are perspective views showing a manufacturing process of a first optical semiconductor device according to an embodiment of the present invention.
Figure 4A:
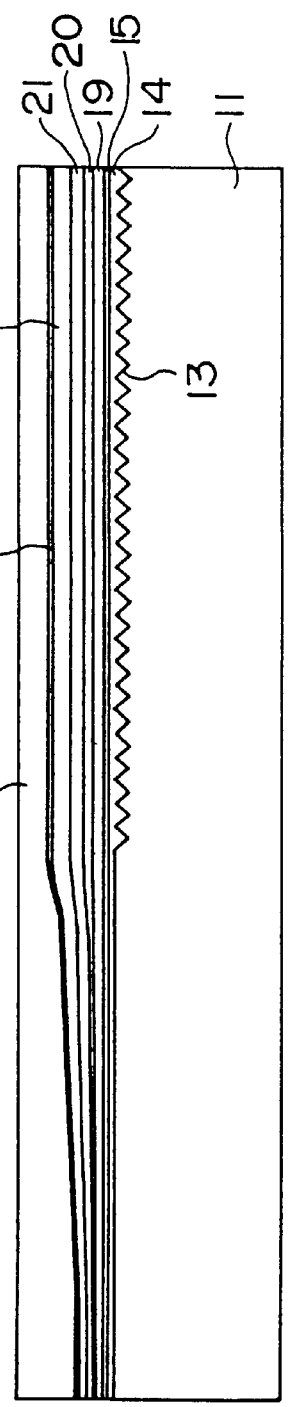
FIG. 4A and FIG. 4B are sectional views showing a part of the manufacturing process of the first optical semiconductor device according to an embodiment of the present invention.
Figure 4B:
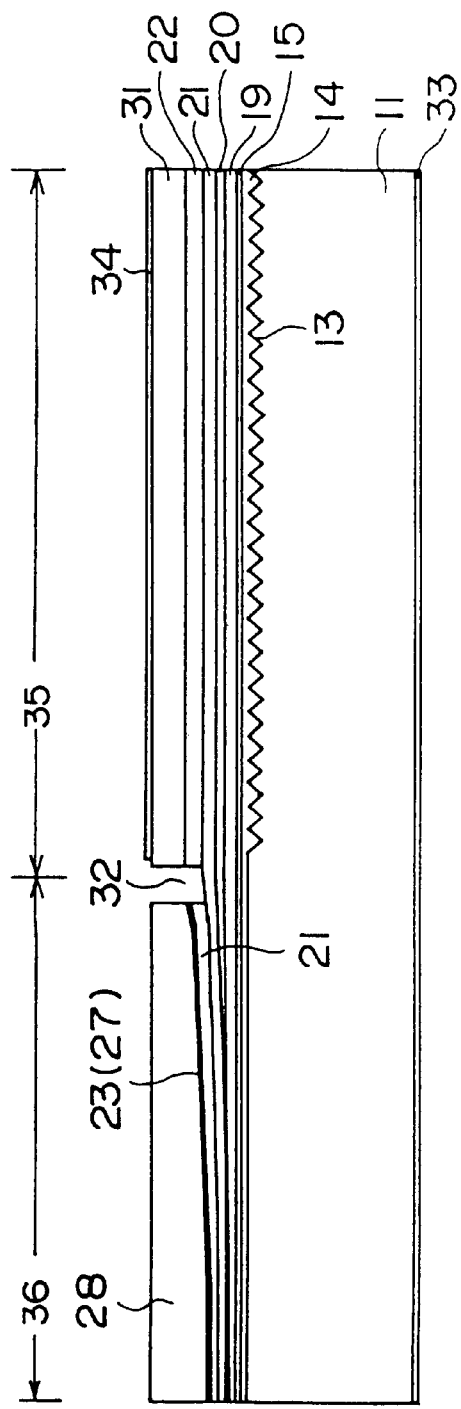
Figure 5:
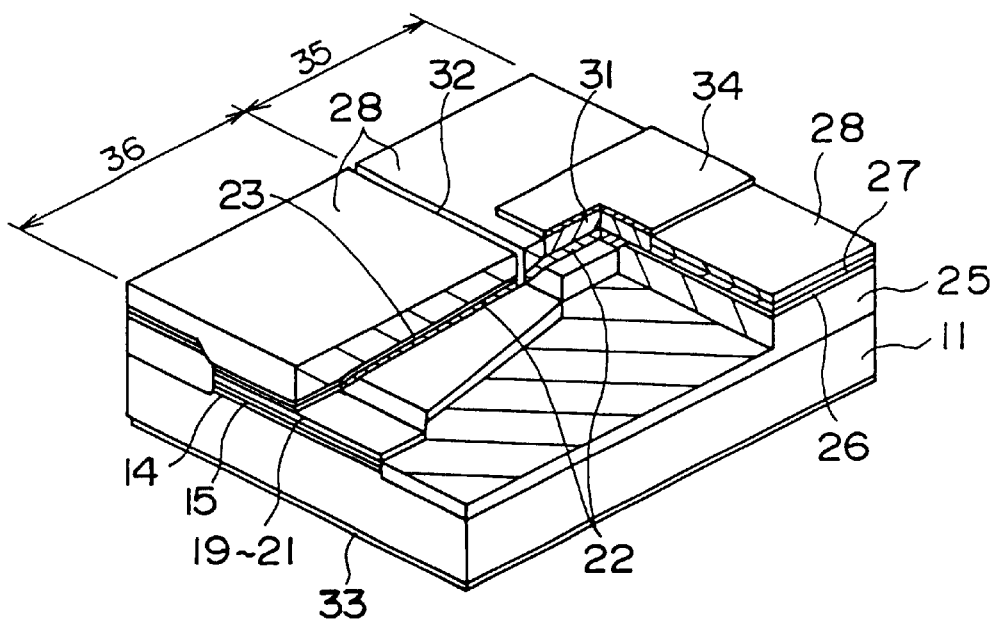
FIG. 5 is a perspective sectional view showing the first optical semiconductor device according to an embodiment of the present invention.

FIG. 3A to FIG. 3K are perspective views showing a manufacturing process of a first optical semiconductor device according to an embodiment of the present invention. FIG. 4A and FIG. 4B are partial sectional views of the manufacturing process, and FIG. 5 is a partly cut out perspective view of a completed optical semiconductor device.

Next, the process to reach a state shown in FIG. 3A will be described.

First, a diffraction grating 13 is formed by an interference exposure method in a region including a semiconductor laser forming region 12 on a surface of an n-InP substrate 11. The diffraction grating 13 is formed of irregularity repeated at a constant pitch in the waveguide direction.

Then, n-InGaAsP whose composition is specified by a wavelength $\lambda g$ of 1.15 $\mu m$ showing the composition is accumulated in a thickness of 150 nm by an epitaxial growth method, thereby to form a guide layer 14. Furthermore, an n-InP buffer layer 15 is formed thereon in a thickness of 10 nm.

Thereafter, an opening is formed by a lithography method in a dielectric film 16 of the semiconductor laser forming region 12 and a waveguide forming region 17 after forming the dielectric film 16 such as $SiO_2$ and $Si_xN_y$ by a thermal CVD method, thereby to form a spatulashaped window 18. The configuration of the semiconductor laser forming region 12 is a rectangle having a longer side in the waveguide direction. On the other hand, the waveguide forming region 17 shows has a obtained by combining a sector portion in which the width thereof widens continuously at a constant angle as becoming more distant from the end portion of the semiconductor laser forming region 12, and a rectanglurer portion that is in contact with the bottom of the sector portion. The width $W_1$ of the window 18 at the end portion of the semiconductor laser forming region 12 is 15 to 20 $\mu m$, and the width $W_2$ of the bottom of the sector portion of the waveguide forming region 17 is 150 to 200 $\mu m$.

Figures 1, 3B:
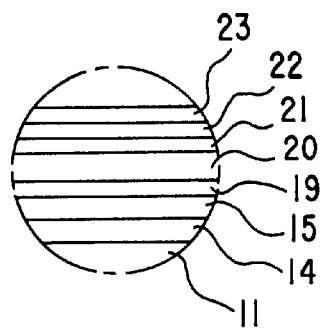
Figure 3B:
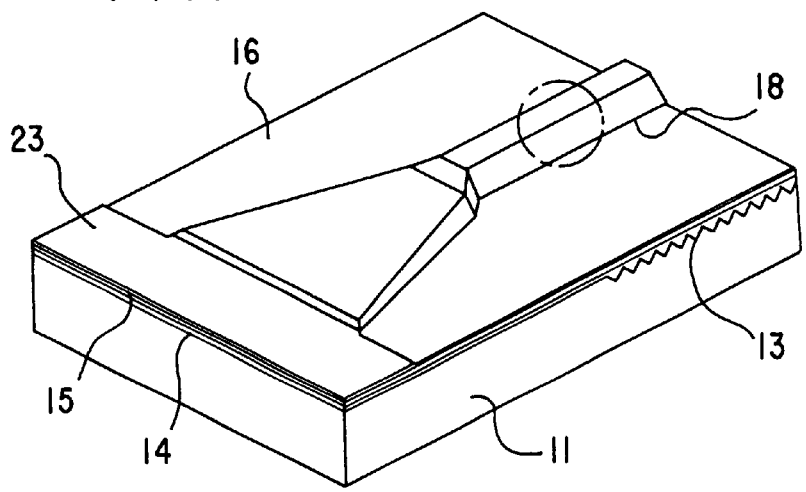

Next, as shown in FIG. 3B, a first InGaAsP guide layer 19 is grown epitaxially, and an MQW layer 20 composed of three InGaAs well layers and InGaAsP barrier layers having a wavelength $\lambda g$ of 1.3 $\mu m$ putting these well layers therebetween, a second InGaAsP guide layer 21, a p-InP cladding layer 22 and an n-InGaAsP etching stop layer 23 are grown one after another epitaxially.

Besides, the InGaAsP guide layer 19 to the etching stop layer 23 may be formed after the surface of the n-InP cladding layer 15 exposed from the window 18 is etched slightly. This etching is for purifying the surface of the cladding layer 15.

These semiconductor layers 19 to 23 are not grown on the dielectric film 16 having no growth nucleus, but are grown in the region of the window 18 selectively. Moreover, since the film thickness of these semiconductor layers 19 to 23 depends on the pattern width W of the window 18, the crystal growth speed becomes lower as the width W gets larger, and the final film thickness becomes thin as shown in FIG. 6. Accordingly, respective semiconductor layers 19 to 23, laminated on the buffer layer 14 through the window 18 are the thickest in the semiconductor laser forming region 12 and gets thinner gradually toward the bottom end portion of the waveguide forming region 17 from the end portions thereof.

Figure 7A:
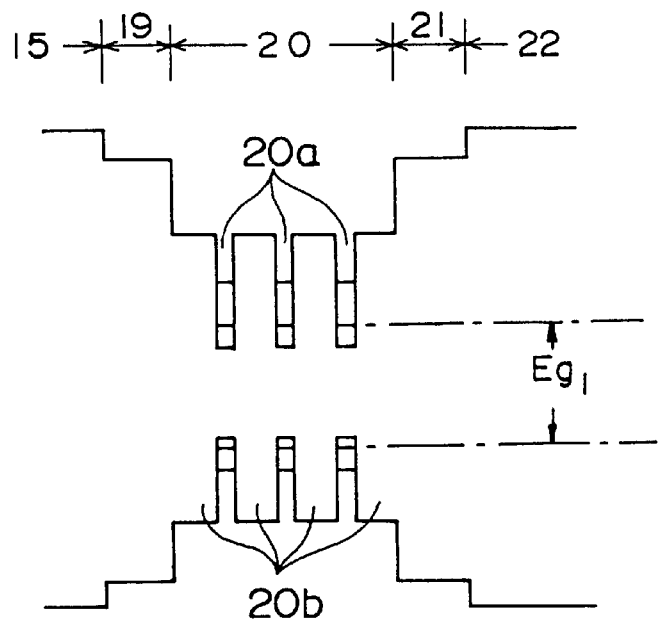
FIG. 7A and FIG. 7B are diagrams each showing an energy band gap of an MQW layer of the first optical semiconductor device according to an embodiment of the present invention.
Figure 7B:
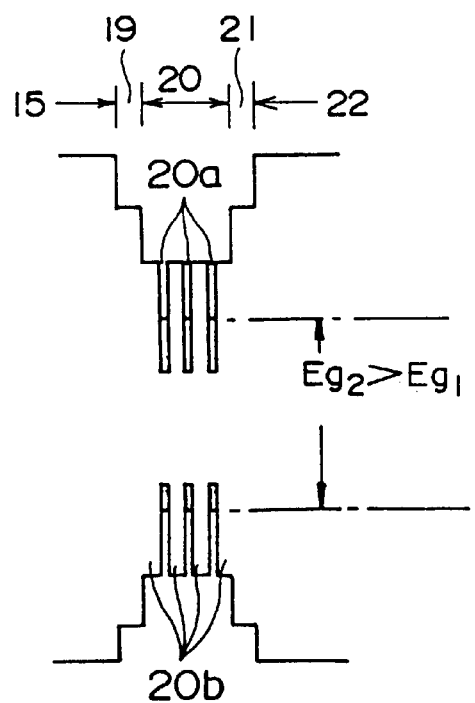

For example, when it is assumed with respect to the MQW layer 20 that the thickness of an InGaAs well layer 20a and the thickness of an InGaAsP barrier layer 20b in the semiconductor laser forming region 12 are 6 nm and 16 nm, respectively, the thickness of the InGaAs well layer 20a and the thickness of the InGaAsP barrier layer 20b at the bottom end portion of the waveguide forming region 17 become 1.5 nm and 4 nm, respectively. Therefore, the energy band thereof appears as shown in FIG. 7A in the semiconductor laser forming region 12 and appears as shown in FIG. 7B in the waveguide forming region 17, respectively.

In the above example, the film thickness of the guide layers 19 and 21 at the bottom end portion of the waveguide forming region 17 is set to 10 nm, and the film thickness of the p-InP cladding layer 22 and the film thickness in the semiconductor laser forming region 12 of the InGaAsP etching stop layer 23 is set to 500 nm and 10 nm, respectively.

Figure 3C:
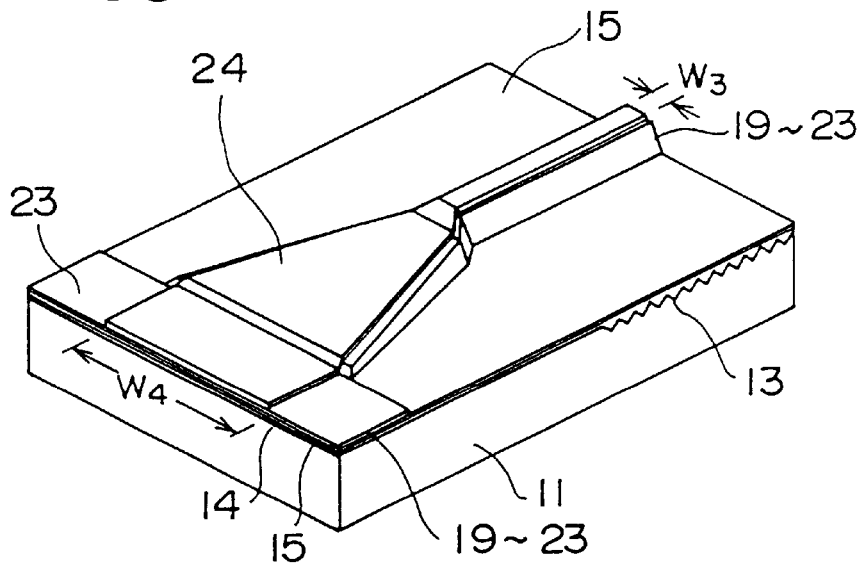
Figure 3D:
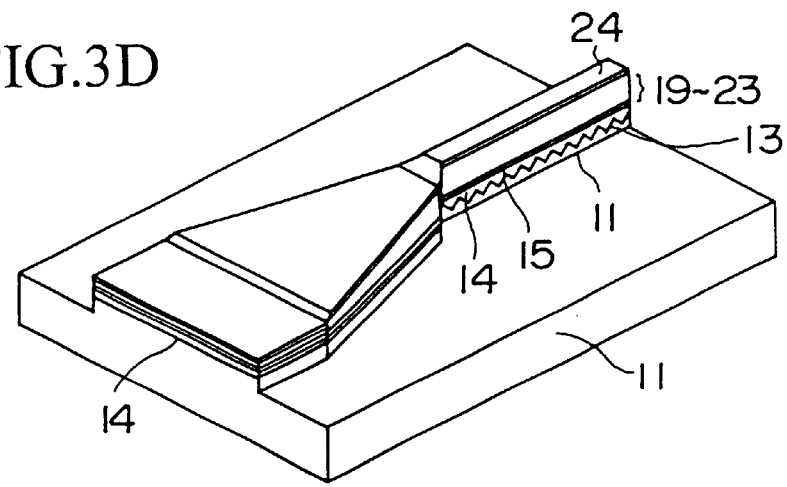

Next, another dielectric film is formed by a thermal CVD method after the dielectric film 16 is removed and is applied with patterning by a lithography technique, thereby to form a mask pattern 24 covering a part of the top of the etching stop layer 23 as shown in FIG. 3C. This mask pattern 24 has a configuration like a spatula exposing edge portions on both sides of the top of the etching stop layer 23. For example, it is a rectangle in shape having the width $W_3$ of 1.5 $\mu$m in the semiconductor laser forming region 12, and has a configuration obtained by putting a sector having a width $W_4$ at the bottom end of 8 $\mu$m and a quadrilateral extended from the bottom end without varying the width together in the waveguide forming region 17. Next, as shown in FIG. 3D, etching is applied continuously up to the etching stop layers 23 located on both sides of the mask pattern 24 and the top of the n-InP substrate 11, thus demarcating the final width of the semiconductor laser and the waveguide for converting optical beam diameter. Namely, the width of the active layer of the semiconductor laser becomes 1.5 $\mu$m, and that of the bottom end of the waveguide becomes 8 $\mu$m.

Figure 3E:
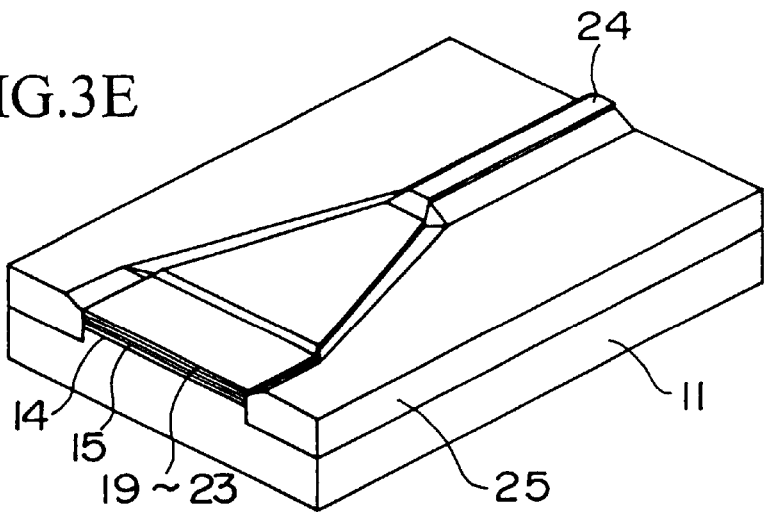
Figure 3F:
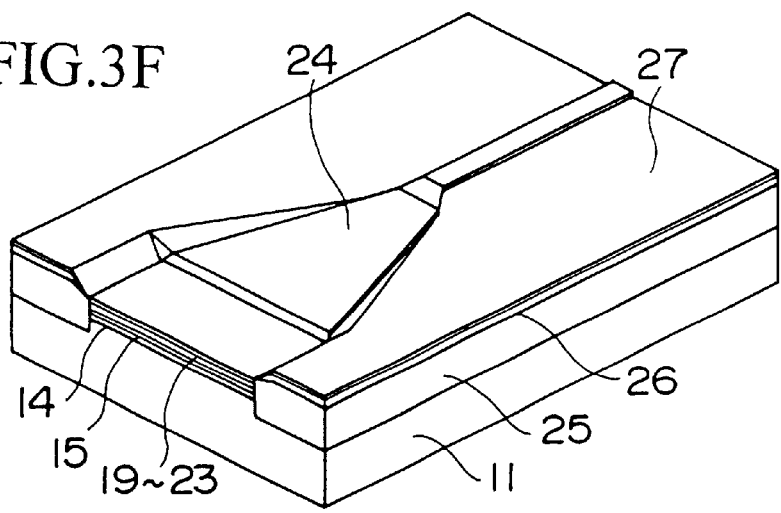

Thereafter, an InP high resistance layer 25 doped with iron is formed by an epitaxial method on the n-InP substrate 11 exposed on both sides of the mask pattern 24 as shown in FIG. 3E. Then, as shown in FIG. 3F, an n-InP current block layer 26 and an InGaAsP etching stop layer 27 are grown epitaxially on the high resistance layer 25.

Figure 3G:
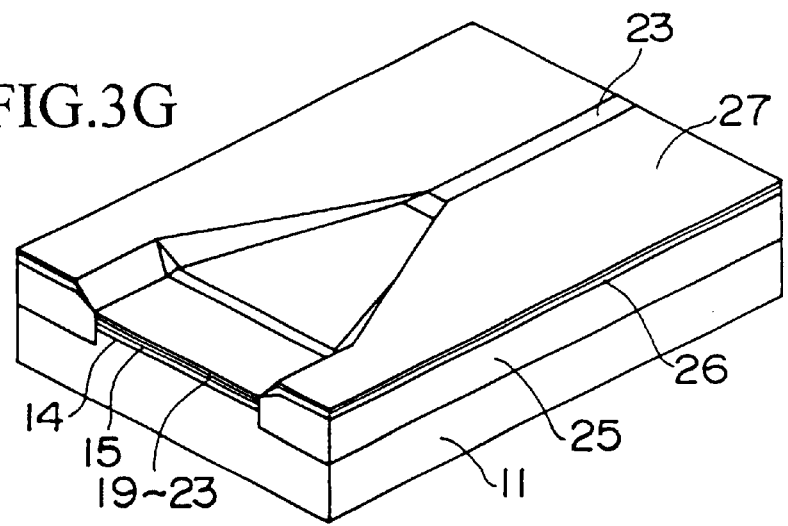
Figure 3H:
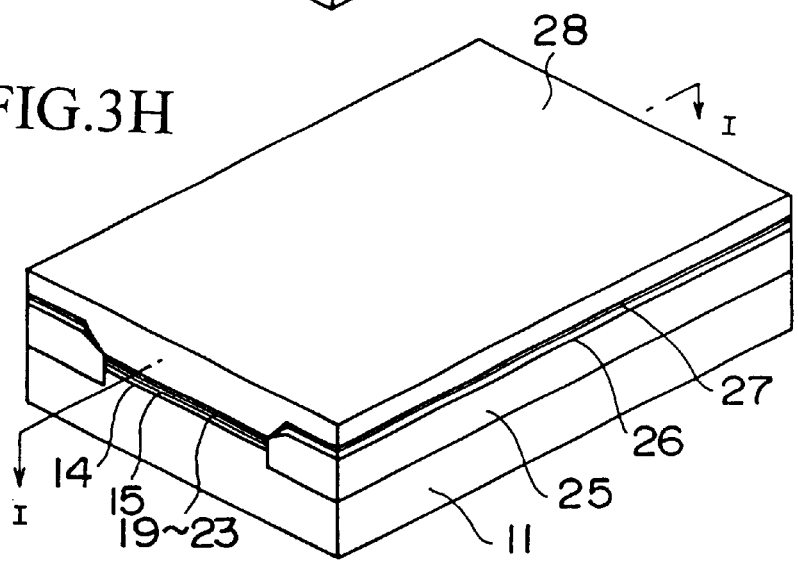

Next, after the mask pattern is removed as shown in FIG. 3G, a non-doped InP cladding layer 28 is grown epitaxially so that the film thickness at the bottom end portion of the waveguide forming region 17 reaches 2.5 $\mu$m or more as shown in FIG. 3H. FIG. 4A is a sectional view taken along a line I—I in FIG. 3H. Here, the reason why non-doped InP is formed without using p-InP is for reducing light absorption by free carriers in the optical beam diameter conversion waveguide.

Figure 3I:
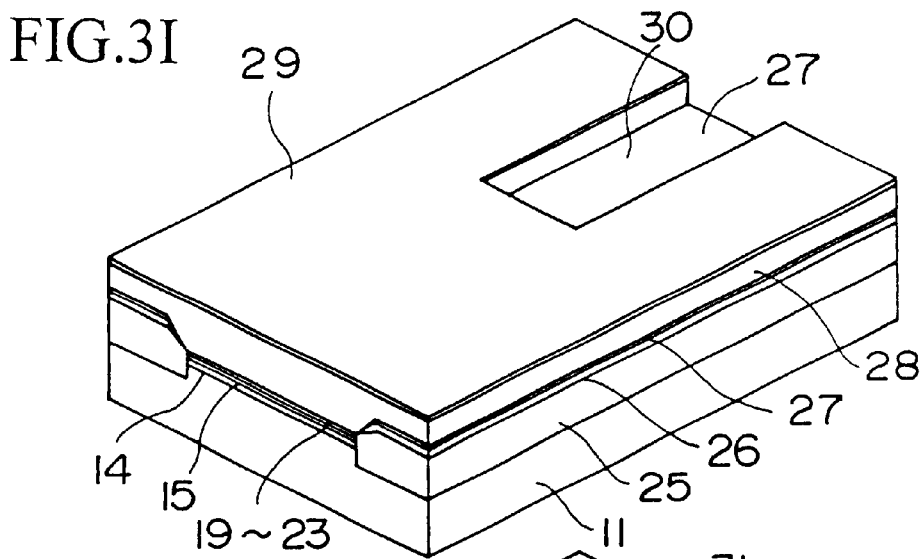

Furthermore, as shown in FIG. 3I, a dielectric film 29 is formed, patterning is applied to this film 29 thereby to form a window 30 in the semiconductor laser forming region 12 and thereabout, and the InP cladding layer 28 exposed from the window 30 is etched selectively. In this case, the etching depth is controlled by the InGaAsP etching stop layers 23 and 27.

Figure 3J:
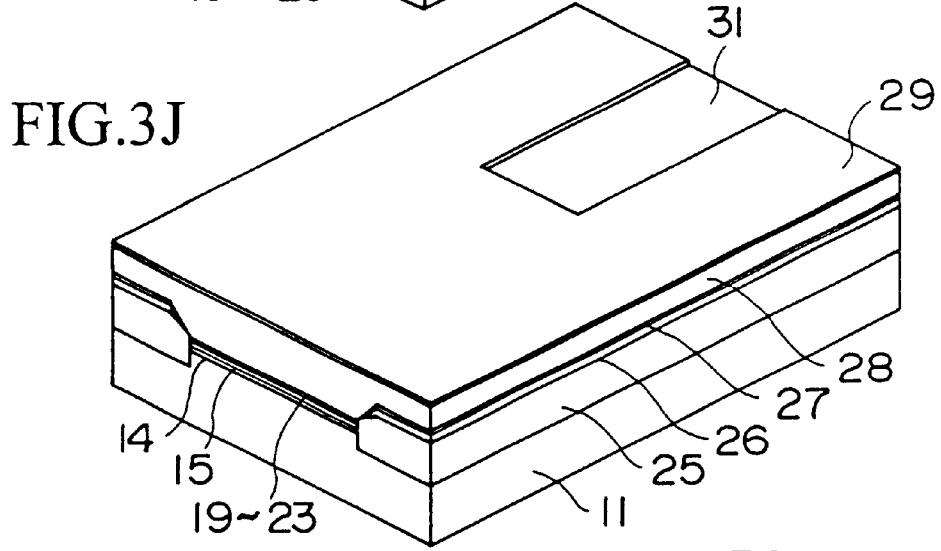

Then, after the etching stop layers 23 and 27 exposed from the window 30 are removed selectively by using an etchant which does not etch the current block layer 26, a p-InP cladding layer 31 is grown epitaxially on the p-InP cladding layer 22 through the window 30 as shown in FIG. 3J, thereby to aim at levelling of the cladding layer 31 and the non-doped InP cladding layer 28.

Figure 3K:
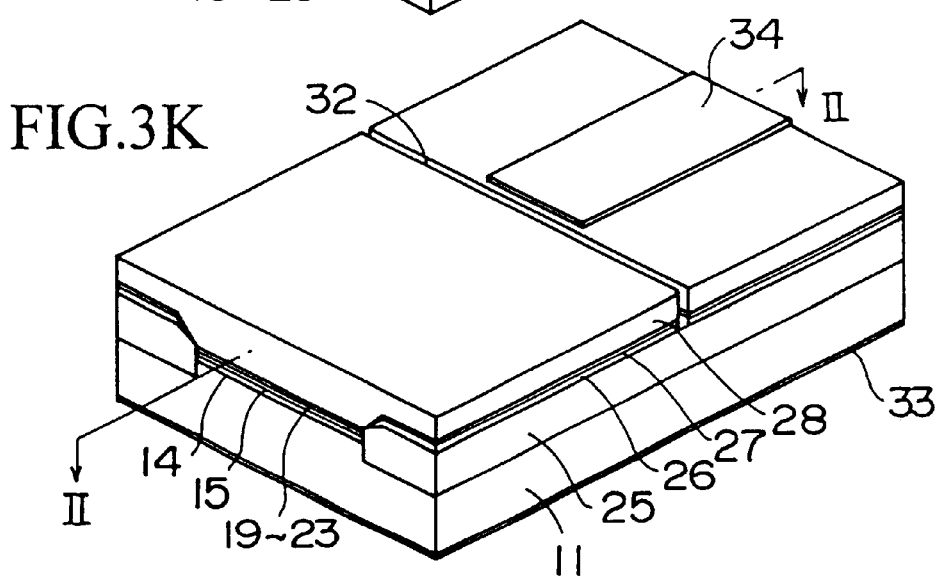

Thereafter, as shown in FIG. 3K, patterning is applied to the non-doped InP cladding layer 28 and the p-InP cladding layer 22 downward thereof, the InGaAsP etching stop layers 23 and 27 and the current block layer 26, thereby to form a groove 32 for separating the semiconductor laser forming region 12 and the waveguide forming region 17 from each other. In the patterning, the guide layer 21 is finally made to function as an etching stop layer.

Furthermore, an n-side electrode 33 is formed on the under surface of the n-InP substrate 11, and a p-side electrode 34 is formed on the p-InP cladding layer 31 in the semiconductor laser forming region 12 at the same time. With this, the forming process of a monolithic BH type semiconductor laser 35 and an optical beam diameter conversion waveguide 36 such as those shown in FIG. 4B and FIG. 5 is completed. Besides, FIG. 4B is a sectional view taken along a line II—II in FIG. 3K.

The width of the MQW layer 20 which becomes a core layer may be made constant. In this case, it is sufficient to set the width of the mask 24 in FIG. 3D constant, e.g., to $W_3$.

The above-mentioned semiconductor laser 35 oscillates by applying a current across the n-side electrode 33 and the p-side electrode 34, and, when the laser light is outputted to the optical beam diameter conversion waveguide 36, the laser light advances while being confined with in the MQW layer 20.

Figure 8:
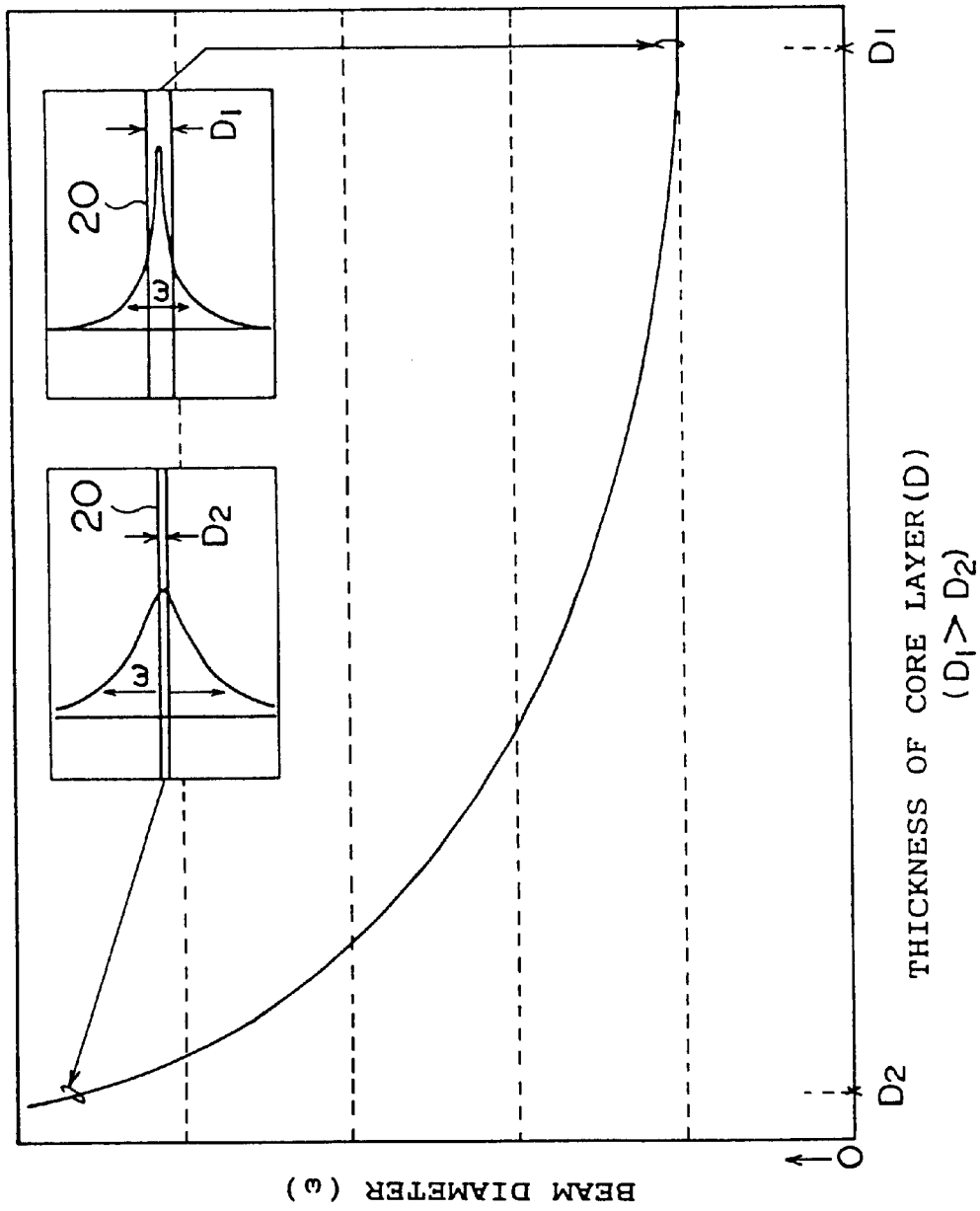
FIG. 8 is a diagram showing the relationship between the thickness of the core layer of an optical beam diameter conversion waveguide and a beam diameter in the first optical semiconductor device according to an embodiment of the present invention.

At this time, in the MQW layer 20 in the optical beam diameter conversion waveguide 36, the film thickness gets thinner as becoming more distant from the semiconductor laser 35, and the optical beam diameter in the film thickness direction spreads itself. This is due to a fact that, since the MQW layer 20 which is the core layer of the waveguide 36 has such a nature that optical confinement gets weaker as the film thickness D thereof gets thinner as shown in FIG. 8, the light emitted from the MQW layer 20 having a thickness of $D_1$ of the semiconductor laser 35 spreads itself in the film thickness direction at the bottom end portion having a thickness of $D_2$ of the optical beam diameter conversion waveguide 36.

Figure 9D:
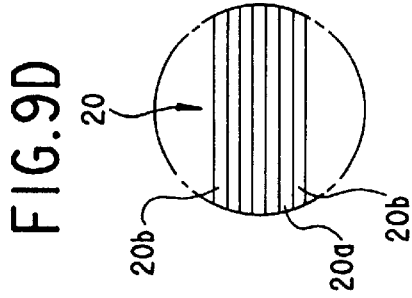
FIG. 9D is a diagram showing the relationship between an optical field strength of an optical electric field strength of an layer shown in FIG. 9B.
Figure 9C:
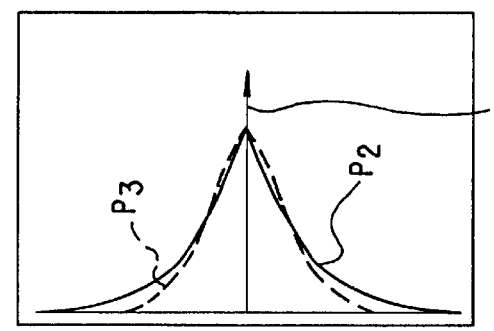
FIG. 9C is a diagram showing the relationship between an optical field strength of an optical electric field strength of an active layer shown in FIG. 9A.
Figure 9B:
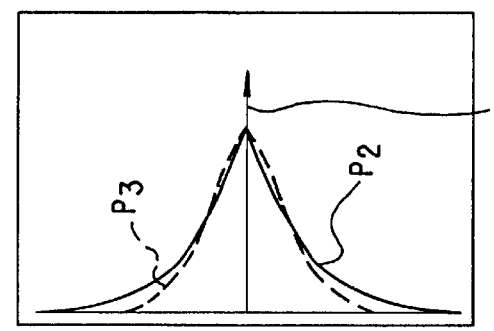
FIG. 9B is an enlarged cross section of a right chain line in FIG. 9.
Figure 9A:
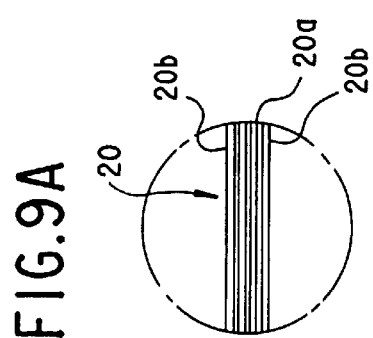
FIG. 9A is an enlarged cross section of a left chain in line FIG. 9.
Figure 9:
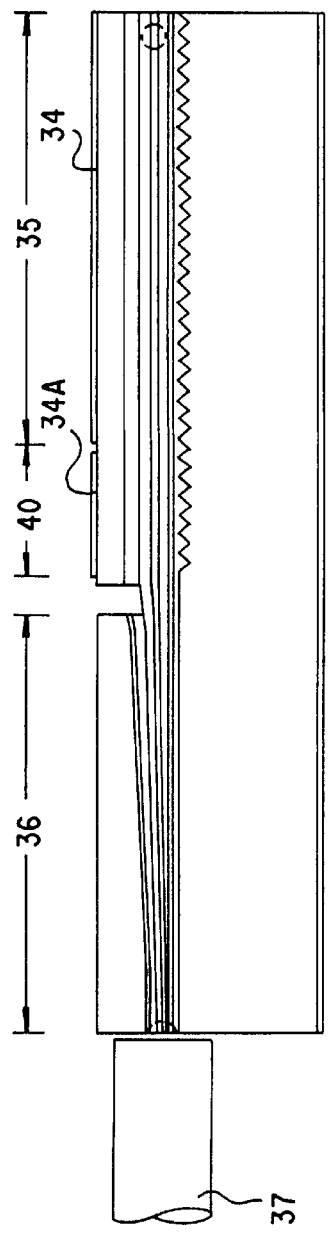
FIG. 9 is an sectional view connecting the first optical semiconductor device with an optical fiber.

Namely, as shown in FIG. 9, as against that a photoelectric field intensity distribution $P_1$ in the semiconductor laser 35 becomes intense sharply in the MQW layer 20, a photoelectric field intensity distribution $P_2$ at the bottom end portion of the optical beam diameter conversion waveguide 36 becomes a broad, which is almost the same as a light intensity distribution $P_3$ of an optical fiber 37 connected to the end portion thereof. Thus, it is realized that the coupling efficiency between the semiconductor laser 35 and the optical fiber 37 is improved due to the existence of the optical beam diameter conversion waveguide 36 described above.

Figure 10A:
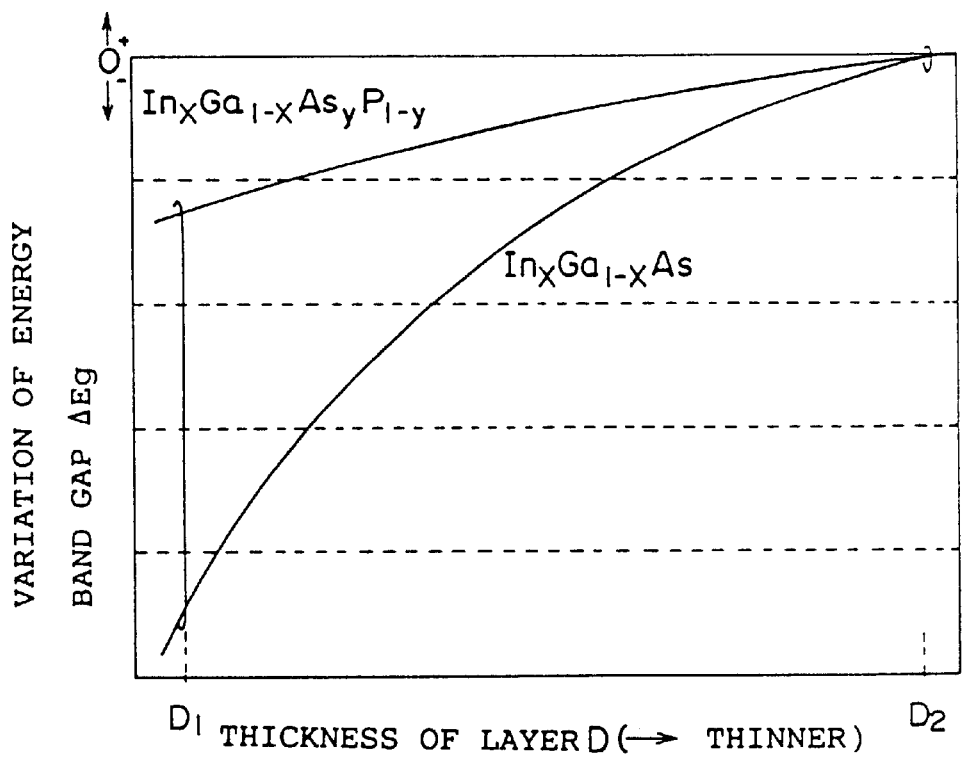
FIG. 10A is a characteristic diagram showing the relationship between the thickness of a well and a barrier of an MQW layer and variation of an energy band gap in the first optical semiconductor device according to an embodiment of the present invention.

Further, in the MQW layer 20, the energy band gap between a quantum level on the valence band side and a quantum level on a conductive band side becomes larger as the well layer gets thinner, and moreover, the energy band gap between the valence band and the conductive band becomes larger ($Eg_1 < Eg_2$) as the film thickness gets thinner as shown in FIG. 7A and FIG. 7B. This is apparent from the relationship between the thickness D of the semiconductor layer and the variations $\Delta Eg$ of the energy band gap such as shown in FIG. 10A.

Figure 10B:
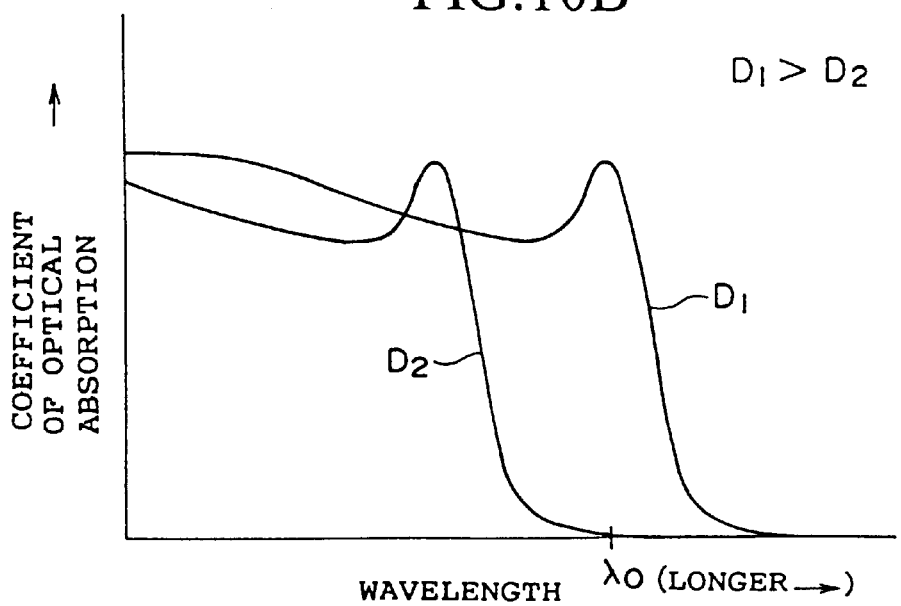
FIG. 10B is a characteristic diagram showing the relationship between a wavelength and a coefficient of light absorption when the thickness of the MQW layer is changed.

When the energy gap becomes larger, the absorption edge of the wavelength band an edge of the optical beam diameter conversion waveguide 36 falls on the side shorter than the wavelength $\lambda_0$ of the light outputted from the semiconductor laser 35 as shown in FIG. 10B. Therefore, it becomes difficult for the optical beam diameter conversion waveguide 36 to absorb the light. As a result, the lowering of the light intensity in the optical beam diameter conversion waveguide 36 is reduced, and the intensity of the light outputted to the optical fiber 37 is increased.

Moreover, when an InGaAs well layer 20a and an InGaAsP barrier layer 20b are compared with each other, it is found that the variation of the film thickness of the well layer is larger. The refractive index of the MQW can be regarded as the average of the refractive indices in which is taken into account with the thickness of the well layer and the barrier layer. Accordingly, the MQW layer 20 at the bottom end of the optical beam diameter conversion waveguide 36 shows a refractive index smaller than that of the MQW layer 20 of the semiconductor laser 35, and the difference in the refractive index from the above and under cladding layers 22 is reduced, thus enlarging the optical beam diameter.

On the other hand, as to the width direction of the MQW layer 20 of the optical beam diameter conversion waveguide 36, the width of the MQW layer 20 becomes wider at the output end. Therefore, the beam diameter of the light confined therein also gets wider in the width (lateral) direction in accordance with the change of the width thereof.

Besides, when the MQW layer 20 gets thinner, optical confinement not only in the film thickness direction but also in the direction perpendicular to the film thickness (the lateral direction) gets weaker even if the width of the MQW layer 20 is fixed. Accordingly, the optical beam diameter spreads, thus improving the coupling efficiency.

Figure 11:
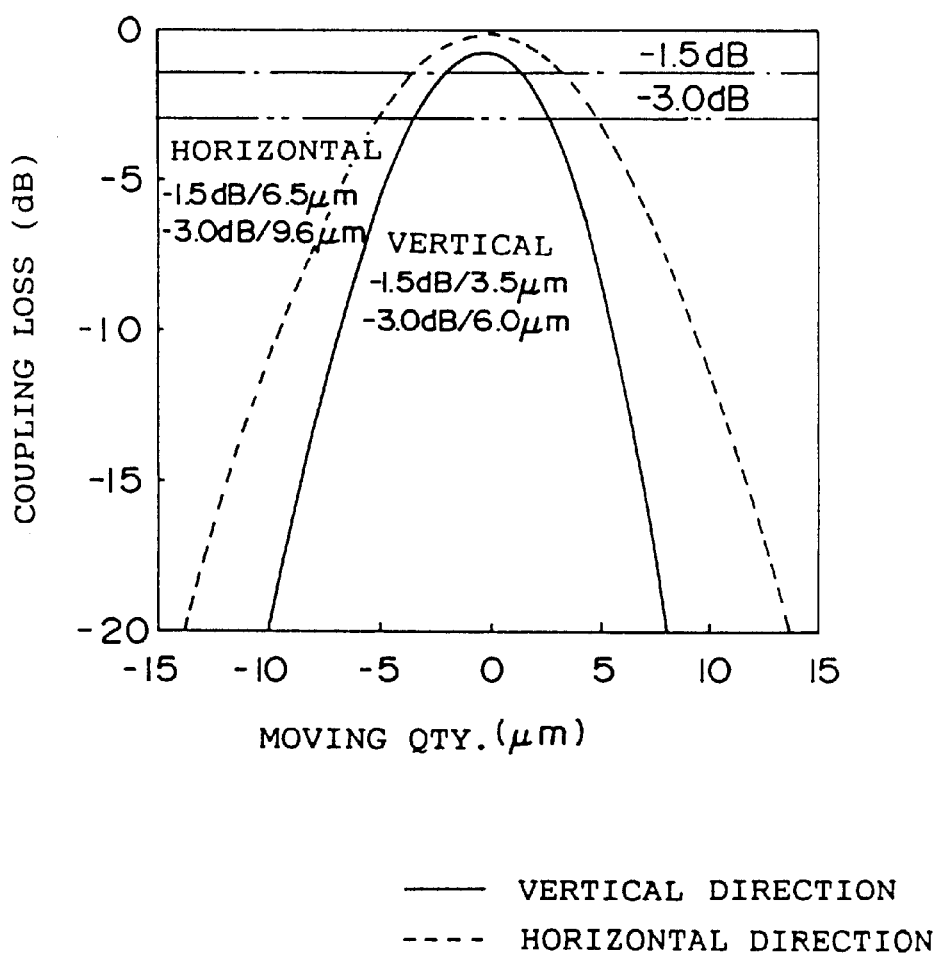
FIG. 11 is a coupling loss characteristic diagram when the first optical semiconductor device according to an embodiment of the present invention is connected to an optical fiber.

Next, when the coupling loss is calculated in the case where the optical fiber 37 having the core diameter of 10 µm and the bottom end of the above-described optical beam diameter conversion waveguide 26 are directly placed opposite each other, a result such as shown in FIG. 11 was obtained.

In FIG. 11, the horizontal axis of abscissas represents (the effect between the respective center axis) of the optical fiber 37 and the wave guide 36, and the vertical axis represents the coupling loss between them. Further, in FIG. 11, a radial solid line shows the coupling loss in a vertical direction (the film thickness direction of the MQW layer) and a radial dashed line shows the coupling loss in a horizontal direction (the width direction of the MQW layer).

Figure 12A:
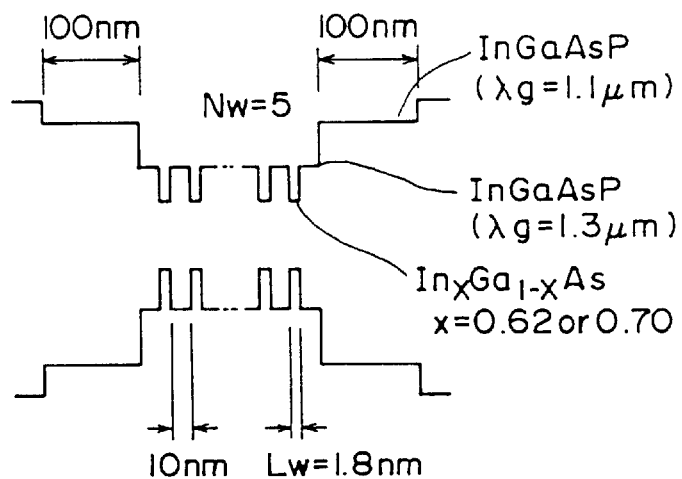
FIG. 12A is an energy band diagram showing an example of a conventional MQW.
Figure 12B:
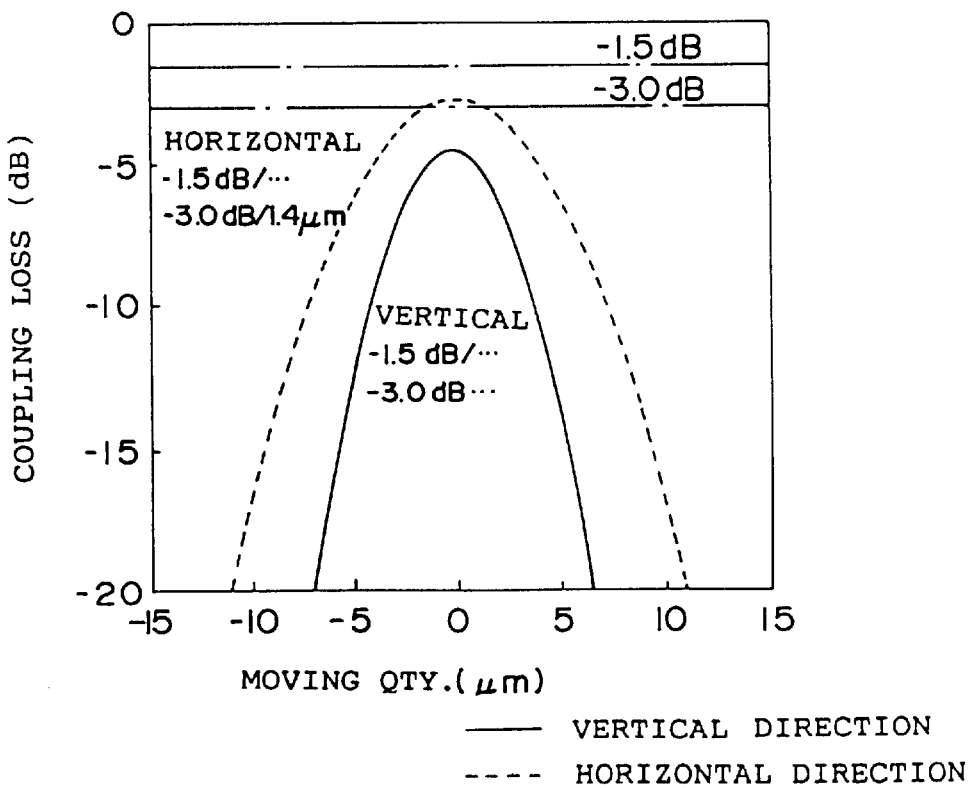
FIG. 12B is a coupling loss characteristic diagram when the semiconductor laser having the conventional MQW is connected to an optical fiber.

As against the above, when the coupling loss is investigated in the case whose a conventional semiconductor laser having such a MQW construction as shown in FIG. 12A and an optical fiber are placed opposite each other directly, such a result as shown in FIG. 12B was obtained. With this, it has been found that the coupling loss is less by 3 Db in the present embodiment.

Figure 13:
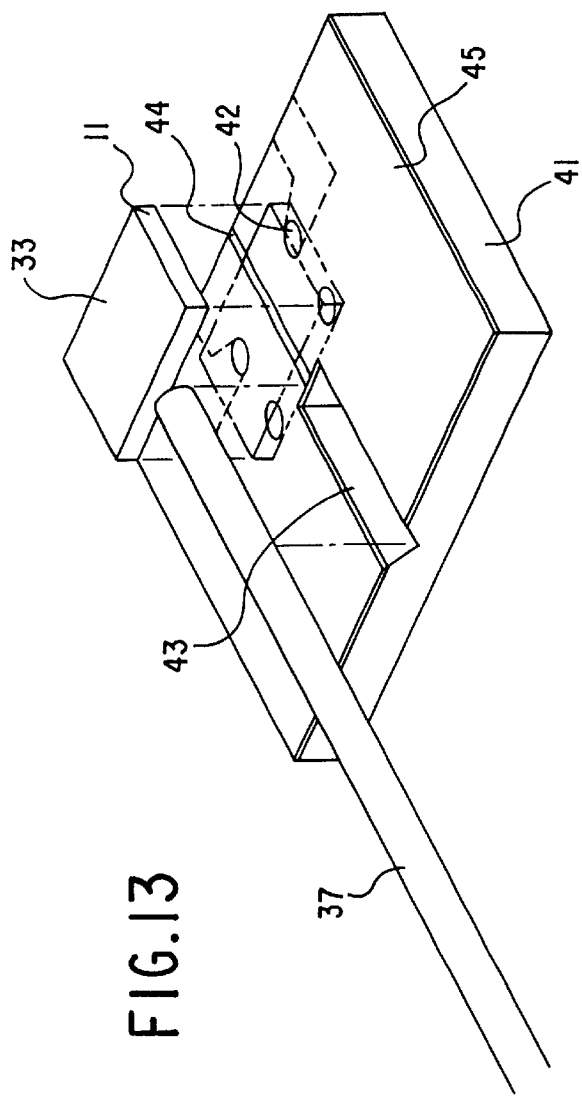
FIG. 13 is a perspective view showing an example of a connecting device of the first optical semiconductor device according to an embodiment of the present invention and an optical, fiber.
Figure 13A:
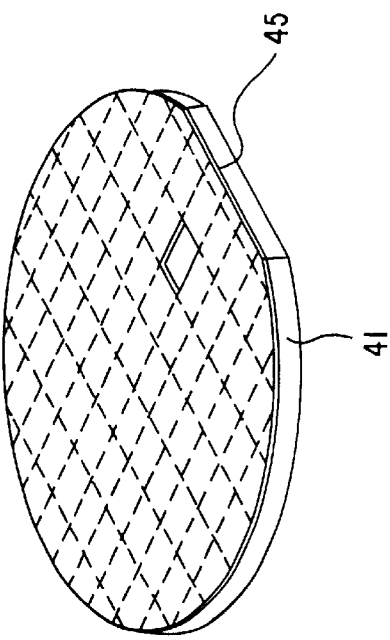

Now, since it is desired to couple the above-mentioned optical semiconductor device with the optical fiber 37 without requiring any adjustment, an example thereof is shown in FIG. 13.

In FIG. 13, a silicon wafer 41 is partitioned into a plurality of sections, and bonding pads 42 for fixing the optical semiconductor device shown in FIG. 5 and a V-shaped groove 43 for mounting the bottom end portion of the optical fiber 37 are formed in each section. Further, in a region where the optical semiconductor device is mounted, an extending electrode 44 to be connected to the p-side electrode 34 of the semiconductor laser 35 is formed. The V-shaped groove 43 is formed by etching the wafer 41 with a KOH solution through a window formed in a dielectric film 45 covering the surface of the silicon wafer 41. In this case, positions of the V-shaped groove 43 and the bonding pads 42 are set in advance so that the positions of the optical output portion of the optical semiconductor device and the V-shaped groove 43 coincide with each other.

Then, the optical fiber 37 is placed in the V-shaped groove 43 and fixed there, once the silicon wafer 41 has been partitioned into chip forms for every section and the p-side electrode 34 of the semiconductor laser 35 has been connected to the extending electrode 44 and bonded onto the chips, thus completing the coupling.

Since the above-mentioned semiconductor laser 35 and optical beam diameter conversion waveguide 36 are isolated electrically from each other by means of the groove 32, a current for driving the semiconductor laser is not spilled into the optical beam diameter conversion waveguide 36, and moreover, the parasitic capacity of the semiconductor laser 35 is neither increased.

Besides, the light is absorbed when a small part of the p-side electrode 34 approximate to the optical beam diameter conversion waveguide 36 is separated and a reverse bias is applied thereto. Therefore, an electric field absorbing type optical modulator 40 may also be formed between the semiconductor laser 35 and the optical beam diameter conversion waveguide 36 as a result of separating a p-side electrode 34A as shown in FIG. 9.

Since the taper configuration in the mode converting region 80 of the MQW layer of this semiconductor laser is obtained by arranging the shape of the mask which is used for growing a film, without changing the etching process, crystal defects become more difficult to be produced in the MQW layer in a tapered form. As a result, deterioration of characteristics by crystal defects becomes no longer produced in this layer. Moreover, the taper configuration is formed with small error and high yield, thus making it possible to obtain beam spots having a uniform configuration.

The Second Embodiment

In the first embodiment described above, a mask having a spatula-shaped window 18 such as shown in FIG. 3A is used in order to vary the film thickness of the semiconductor layers 19 to 23 forming the optical beam diameter conversion waveguide 36. Further, a waveguide forming region 17 of the window 18 has almost a sector shape expanding continuously at a fixed angle, but a window 38 of a pattern expanding almost stepwise may also be formed by forming portions 38A to 38D where the width is not changed and spreading portions 38E to 38H alternately.

With this, the film thickness of the semiconductor layers 19 to 23 of the window optical beam diameter conversion waveguide 36 becomes thinner stepwise toward the bottom end portion as shown in FIG. 15, and the characteristic thereof is almost the same as that of the first embodiment.

Besides, since it is preferable to form the steps produced in the thickness direction of the semiconductor layers 19 to 23 as small as possible, it is desirable that the width of the window 18 of the mask is changed by as many steps as possible. In a region where it is desired to make the difference of the coefficient of optical absorption larger, the variation of the thickness of the semiconductor layers may be made larger by making the variation of the width larger.

An example of a method of mass production of optical semiconductor devices in which a semiconductor laser and an optical beam diameter conversion waveguide are formed in a monolithic manner will be described in the next place.

For the purpose of mass production, a plurality of windows 38A in a configuration in which the semiconductor beam forming regions 12 and the optical beam diameter conversion waveguide regions 17 shown in FIG. 3A are connected in series repeatedly as shown in FIG. 16 are arranged at predetermined intervals in parallel with a dielectric film 16A.

Thereafter, a plurality of optical semiconductor devices each having a semiconductor laser and an optical beam diameter conversion waveguide are formed continuously on the substrate through the process such as described in the first embodiment. Thereupon, it is sufficient to cleave the substrate 11 along cut lines $L_{11}$ to $L_{14}$ and $L_{21}$ to $L_{26}$ so as to separate the optical semiconductor device individually.

The Third Embodiment

Figure 17A:
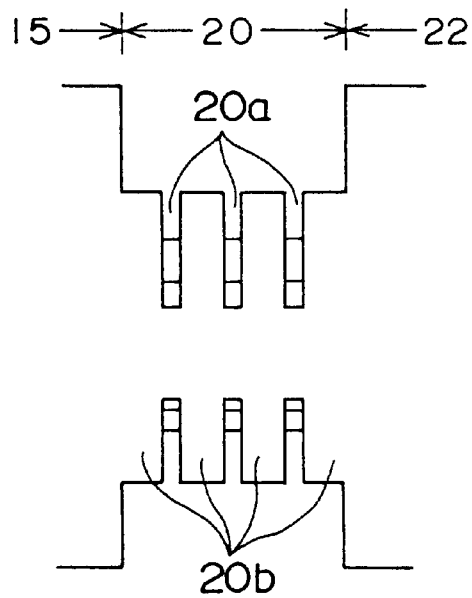
FIG. 17A and FIG. 17B are diagrams each showing an energy band gap of an MQW layer of a third optical semiconductor device according to an embodiment of the present invention.
Figure 17B:
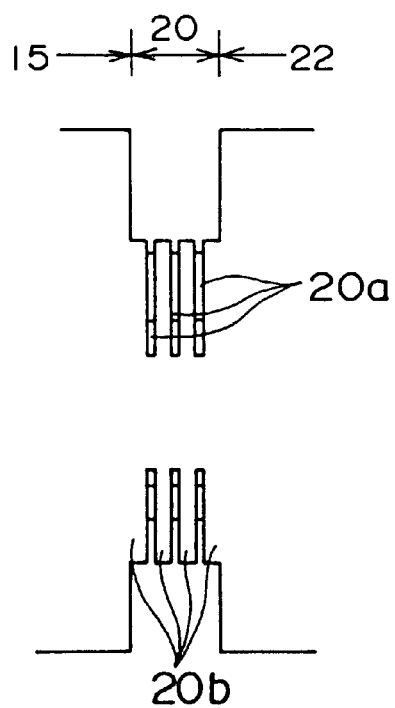

The guide layers 19 and 21 are provided above and below the MQW layer 20 in the first embodiment described above, but a construction without these layers may also be adopted. The energy band thereof appears as shown in FIG. 17A and FIG. 17B.

However, the well layer and the barrier layer become as thin as several nm as getting near the bottom end portion of the optical beam diameter conversion waveguide 36. Therefore, when the guide layers 19 and 21 are not provided, the difference of the refractive index in the width (lateral) direction is too small and optical confinement becomes weaker.

Figure 18A:
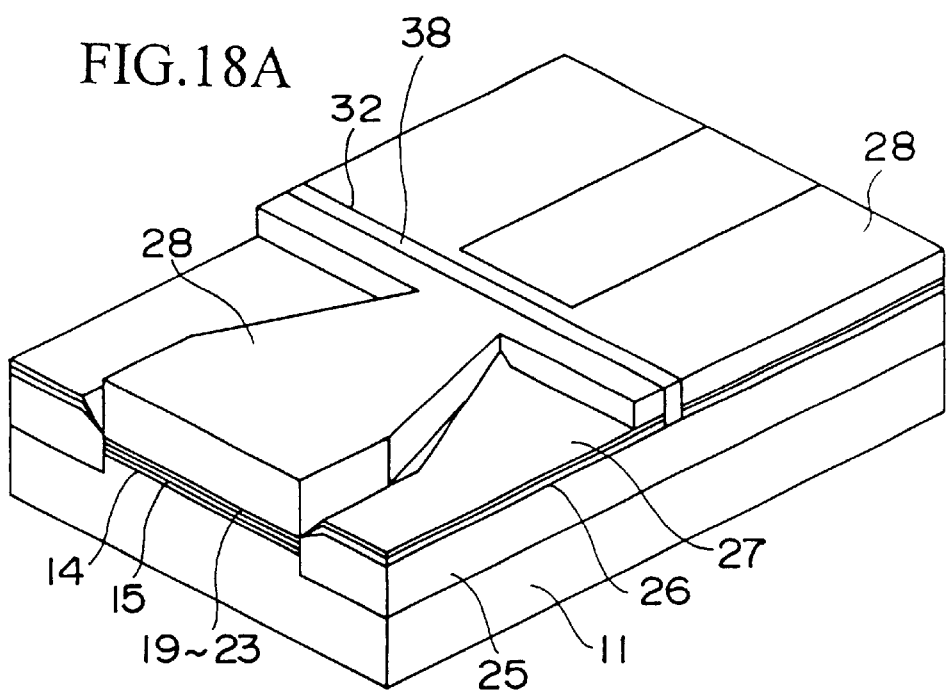
FIG. 18A and FIG. 18B are perspective views each showing a part of a manufacturing process of the third optical semiconductor device according to an embodiment of the present invention.
Figure 18B:
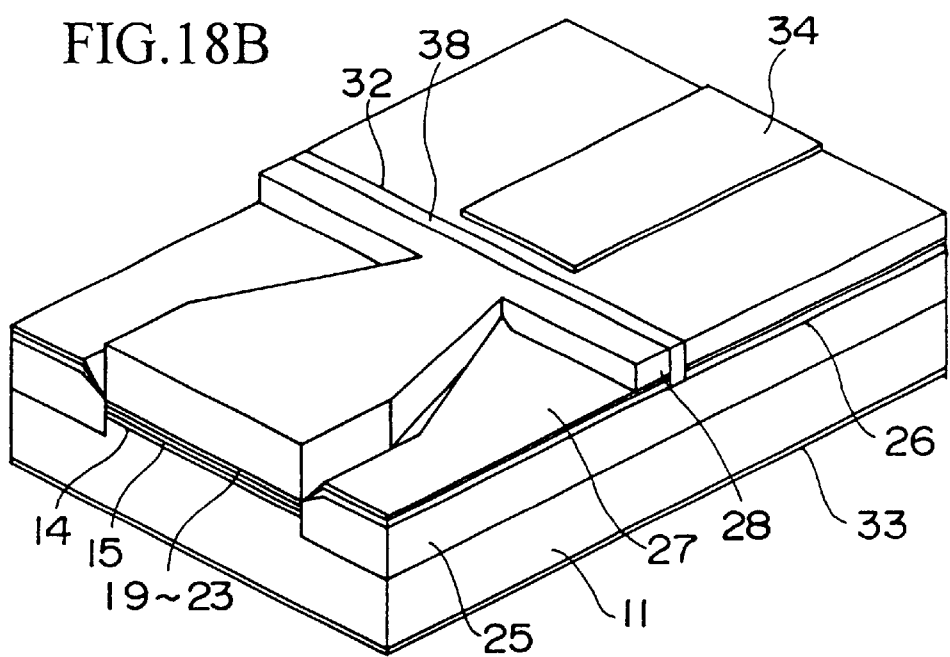

Therefore, a ridge construction in which an uppermost cladding layer 28 of the optical beam diameter conversion waveguide 36 is formed in a plane configuration same as the MQW layer 20 as shown in FIG. 18A and FIG. 18B is adopted. With this, the both sides of the cladding layer 28 are exposed to the open air. Thus, a lateral mode is guided and optical confinement is improved.

In order to form the cladding layer 28 in a ridge construction, as shown in FIG. 18A, a groove 32 for separating the optical semiconductor laser 35 from the optical beam diameter conversion waveguide 36 is filled with an insulating material 38 such as polyimide to be flattened, and then patterning is applied to the cladding layer 28 by a photolithography method with a dielectric film such as $SiO_2$ and SiN as a mask, thereby to form the ridge construction. It is sufficient to form an n-side electrode 33 and a p-side electrode 34 thereafter as shown in FIG. 18B.

Figure 19:
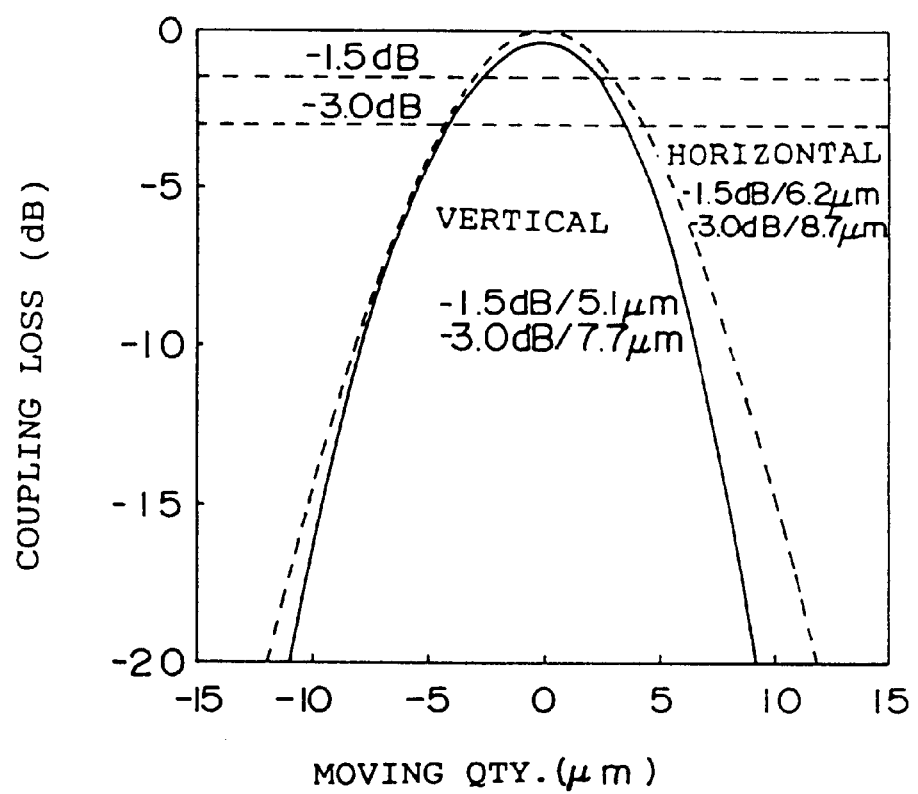
FIG. 19 is a coupling loss characteristic diagram when the third optical semiconductor device according to an embodiment of the present invention is connected to an optical fiber.

Next, when the coupling loss when the optical fiber 37 having a core diameter of 10 μm and the bottom end of the above-mentioned optical beam diameter conversion waveguide 26 are placed directly opposite each other was computed, a result as shown in FIG. 19 was obtained, which was better than the result obtained in the first embodiment shown in FIG. 11.

The Fourth Embodiment

In the optical beam diameter conversion waveguide 36 in the first embodiment, the cladding layers 15, 22 and 28 above and below the MQW layer 20 which becomes the core layer are made of the same material as that of the semiconductor laser 35, but cladding layers 15A and 22A may be formed of a material such as InGaAsP having a refractive index smaller than that of the cladding layer of the semiconductor laser 35 as shown in FIG. 20.

According to the above, optical confinement in the optical beam diameter conversion waveguide 36 becomes smaller, thus making it possible to make the optical beam diameter in the film thickness direction larger. Furthermore, when the cladding layers 15A and 22A are non-doped, light absorption by free carriers is reduced.

Besides, an InGaAsP etching stop layer 23A is provided between the guide layer 21 and the cladding layer 22, thus adjusting the etching depth when the cladding layers 22 and 28 located in the optical beam diameter conversion waveguide 36 are removed, and an upper non-doped InGaAs cladding layer 22A is formed after the etching.

The Fifth Embodiment

A semiconductor laser is used as an active element connected to the optical beam diameter conversion waveguide in the first embodiment described above, but a photodiode may also be adopted.

When a reverse bias is applied to the semiconductor laser 35, the element thereof functions as an end face wave conductive type photodiode of a pin junction construction.

Further, a photodiode of pn junction and an end face light emitting type light emitting diode of pn junction or pin junction may also be used as an optical active element. In this case, although it is not illustrated in particular, the construction of the core layer of the optical beam diameter conversion waveguide connected to the photodiode or the light emitting diode becomes the same as that of the optical absorption layer or the active layer of the optical active element.

Further, when the photodiode is formed in one body with the optical beam diameter conversion waveguide, it may also be arranged to form a recessed portion in a photodiode forming region and to form a photodiode therein as shown in FIG. 21 for instance.

The process thereof will be described briefly.

First, after forming an n-InP buffer layer 52 and an InGaAsP etching stop layer 53 successively on an n-InP substrate 51, a dielectric mask having an almost spatula-shaped window similar to those shown in FIG. 3A and FIG. 15 for instance is used, and an n-InP cladding layer 54, an InGaAs core layer 55 and a non-doped InP cladding layer 56 are formed on the etching stop layer 53 through that window. At this time, the core layer 55 and the upper and lower cladding layers 54 and 56 are thick in the region of a photodiode 57 and get thinner as going toward the bottom end portion of an optical beam diameter conversion waveguide 58. This is due to the principle same as that of the first embodiment.

Thereafter, those semiconductors located in the forming region of the photodiode 57 among the semiconductors on the etching stop layer 53 are removed so as to form a recessed portion 59, and an n-InP layer 60, an i-InGaAs layer 61 and a p-InP layer 62 are laminated one after another therein thereby to form the pin junction portion of the photodiode 57. Then, finally, a p-side electrode 63 is formed on the p-InP layer 62, and an n-side electrode 64 is formed under the n-InP substrate 51.

When the light which has propagated through the optical beam diameter conversion waveguide 58 is incident to the i-InGaAs layer 61 of the photodiode 57 in a state that reverse bias is applied to the photodiode 57 having such a construction, a current is applied between the electrodes 63 and 64.

At this time, when the energy band gap of the core layers 55 located before and behind the photodiode 57 is set to a wavelength shorter than 1.3 μm at the optical wavelength conversion, the i-InGaAs layer 61 is thicker than the core layer 55 and the energy band gap becomes smaller, thus making it possible to use the light having a wavelength band longer than 1.3 μm, and the coefficient of optical absorption and the optical confinement efficiency are improved, thus making it possible to obtain a high quantum efficiency with a short absorption layer.

Besides, the photodiode 57 buried in the recessed portion 59 may be of an ordinary pn junction type by impurity diffusion.

Figure 22:
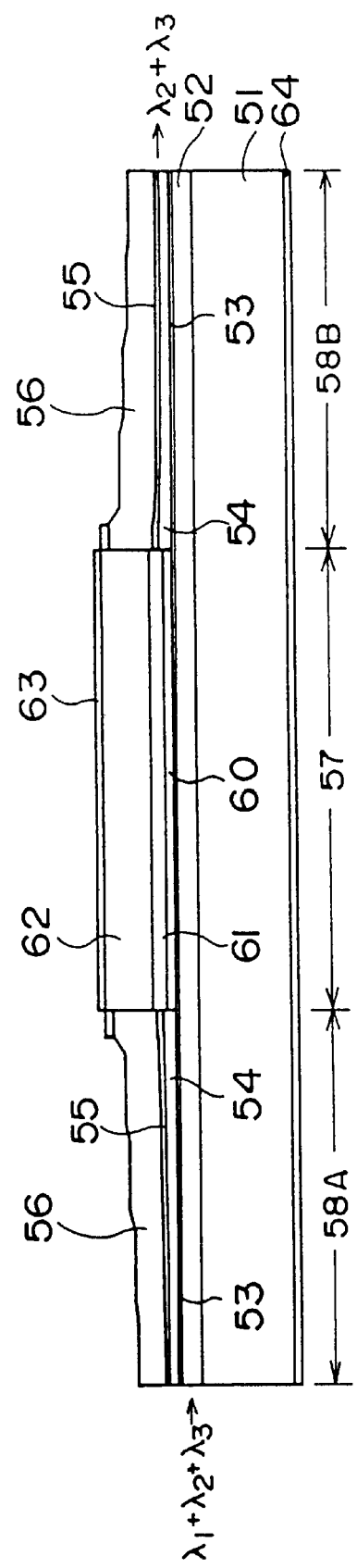
FIG. 22 is a sectional view showing another construction of the fifth optical semiconductor device according to an embodiment of-the present invention.

Now, as shown in FIG. 22, it may also be arranged so that the optical beam diameter conversion waveguides 58A and 58B are formed before and behind the recessed portion 59, respectively, optical signals $\lambda_1+\lambda_2+\lambda_3$ having a plurality of wavelengths are inputted to the waveguide 58A on the input side, only the signal $\lambda_1$ of a specific wavelength is taken out by the photodiode 57 formed in the recessed portion 59, and the remaining signals are outputted from the waveguide 58B on the output side.

It is required to select a semiconductor having such an energy band gap that can take out only the light having a specific wavelength with respect to the material of the core layer of the photodiode 57 in this case.

When the light $\lambda_2$, $\lambda_3$ is passed through the photodiode 57, the light spreads in the width direction through the core layer 55 of the optical beam diameter conversion waveguide 58B, and optical confinement gets weaker in the thickness direction of the core layer as going toward the end portion. Thus, the optical beam diameter gets large. Further, when the light $\lambda_1$, $\lambda_2$, $\lambda_3$ inputs to the core layer 55 of the optical beam diameter conversion waveguide 58A, the optical confinement becomes more intense as going toward the photodiode 57, and the optical beam diameter get smaller.

The Sixth Embodiment

Figure 23B:
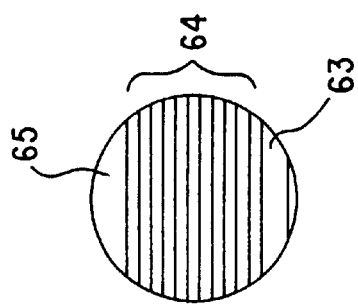
FIG. 23B is an enlarged view of a center chain line in FIG. 23.
Figure 23A:
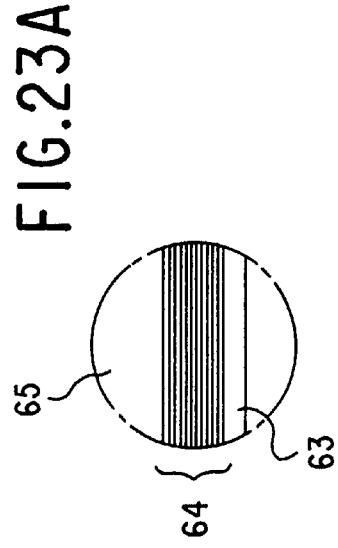
FIG. 23A is an enlarged view of a left chain line or a right chain area in FIG. 23.
Figure 23:
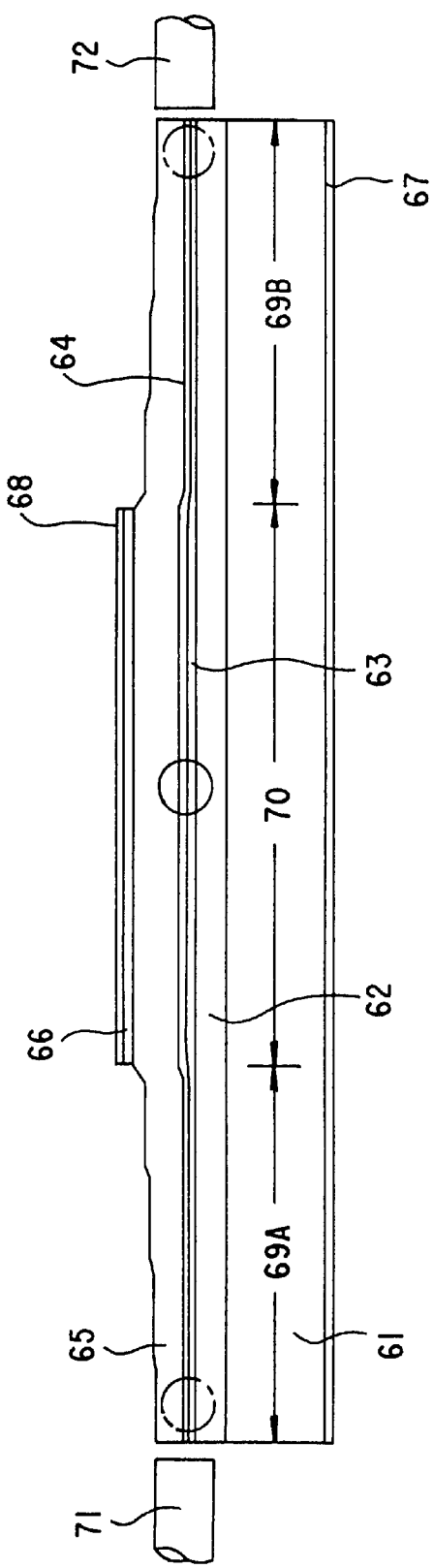
FIG. 23 is a sectional view showing a sixth optical semiconductor device according to an embodiment of the present invention.

FIG. 23 shows an optical semiconductor device in which a travelling wave type laser amplifier and an optical beam diameter conversion waveguide are formed in a monolithic manner.

This device is obtained by forming an n-InP buffer layer 62 and an n-InP cladding layer 63 on the n-InP substrate 61, forming an active layer (core layer) 64 structured of MQW composed of i-InGaAs and i-InGaAsP thereon, and forming thereafter a p-InP cladding layer 65 and a p-InP contact layer 66 at the center thereof. Further, an n-side electrode 67 is formed under the n-InP substrate 61, and a p-side electrode 68 is connected to the contact layer 66.

In this optical semiconductor device, respective semiconductor layers above the n-InP cladding layer 63 are thickest at the central region thereof, and are made to get thinner as getting near the end portions before and behind the region.

Further, two regions where semiconductor layers in which the film thickness varies become optical beam diameter conversion waveguides 69A and 69B, and a semiconductor laser amplifier 70 is formed by a semiconductor layer in the central region thereof.

The variation of the thickness of the semiconductor film is achieved by epitaxial growth using another mask having a window showing a narrow width at the center having a shape looking like two masks such as shown in FIG. 3A and FIG. 14 put together.

In this case, since not only the coupling between the semiconductor laser amplifier 70 and the optical beam diameter conversion waveguides 69A and 69B is good, but also the beam diameters at the exposure end portions of the optical beam diameter conversion waveguides 69A and 69B become larger. Hence, the coupling efficiency with optical fibers 71 and 72 is high. With this, the total optical amplification factor becomes larger.

Besides, a p-side electrode 68 may also be formed on the optical beam diameter conversion waveguides 69A and 69B.

Now, a pin junction is formed between the semiconductor laser amplifier 70 and the active layer (core layer) 64 of the optical beam diameter conversion waveguides 69A and 69B in the optical semiconductor device shown in FIG. 23, but, when a pn junction of the active layer 64 of the laser amplifier 70 is formed, the pn junction is also formed for the active layer 64 of the optical beam diameter conversion waveguides 69A and 69B.

Besides, this semiconductor laser amplifier 70 is driven by applying a positive bias to the electrodes 67 and 68. Since light is absorbed when a reverse bias is applied, however, it is also possible to use the optical semiconductor device shown in FIG. 23 as an electric field absorbing type optical modulator.

When the optical semiconductor device such as shown in FIG. 23 is mass-produced, it is sufficient to form a dielectric film 16A having windows 38A as shown in FIG. 16, to form semiconductors selectively on the windows 38A, and to cleave the semiconductors along $L_{11}$, $L_{13}$ and $L_{21}$, $L_{22}$, $L_{23}$, $L_{24}$, $L_{25}$ and $L_{26}$ thereafter.

Besides, in the first to the sixth embodiments described above, the light propagation loss of the semiconductor is reduced by either forming no electrode on the top side of the optical beam diameter conversion waveguide or non-doping a semiconductor forming a cladding layer. When impurities are doped in the cladding layer, however, if the thickness of doping is restricted as small as possible, absorption by free carriers is reduced and the light propagation loss is reduced.

Further, when the above-mentioned optical semiconductor device is designed in an optimal manner, the maximum coupling efficiency of 90% or higher is obtainable, and in addition, large values of 5 μm in a vertical (longitudinal) direction and 6 μm in a horizontal (lateral) direction are obtainable as a coupling tolerance against lowering the coupling efficiency by 3 Db.

The Seventh Embodiment

Figure 24:
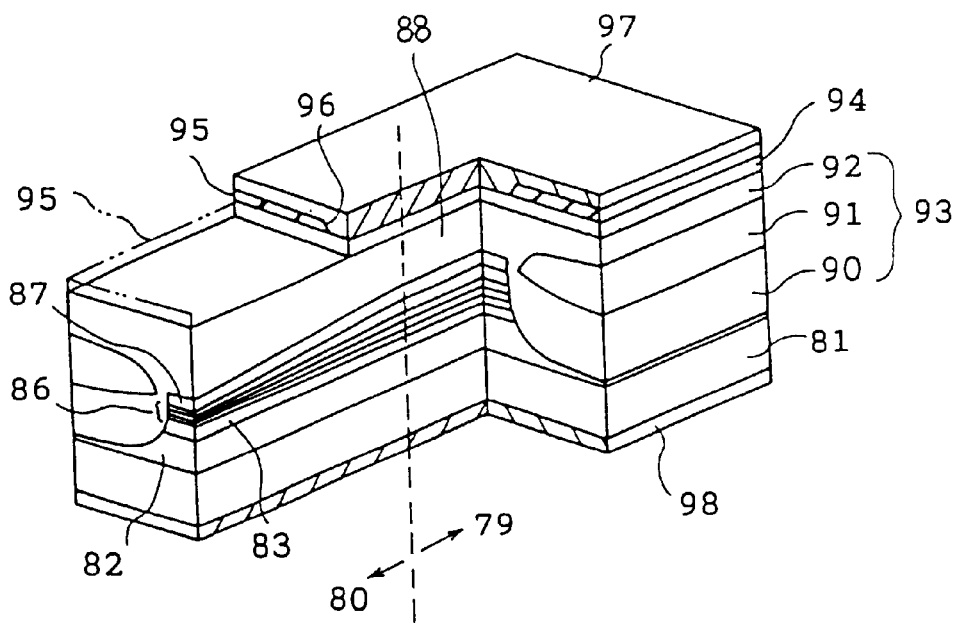
FIG. 24 is a perspective sectional view of a seventh optical semiconductor device according to an embodiment of the present invention.

FIG. 24 is a perspective sectional view showing a Fabry-Pérot semiconductor laser according to an embodiment of the present invention.

This semiconductor laser has such a construction that a gain peak appears in a 1.3 μm band, and the construction will be described along the manufacturing process.

Figure 25A:
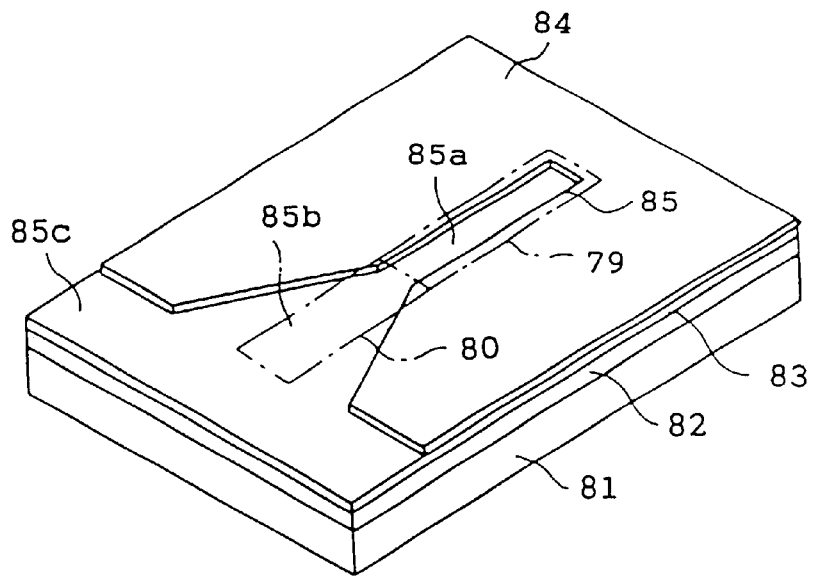
FIG. 25A and FIG. 25B are perspective views each showing the manufacturing process of the seventh optical semiconductor device according to an embodiment of the present invention.

First, as shown in FIG. 25A, a first mask 84 with at least a gain region A and a mode conversion region B opened is formed on an n-type (n⁻) InP substrate 81.

The mask 84 is obtained by patterning an insulating film such as a silicon nitride film by photo-lithography, and the configuration of an opening portion 85 of the mask 84 has a rectangular portion 85a having a length of 400 μm extending in a light travelling direction in a gain region 79, a sector portion 85b having a length of 350 μm with the width spreading continuously at a constant angle as becoming more distant from the end portion of the rectangular portion 85a, and an extended portion 85c spread further from the end portion of the sector portion 85b.

Figure 25B:
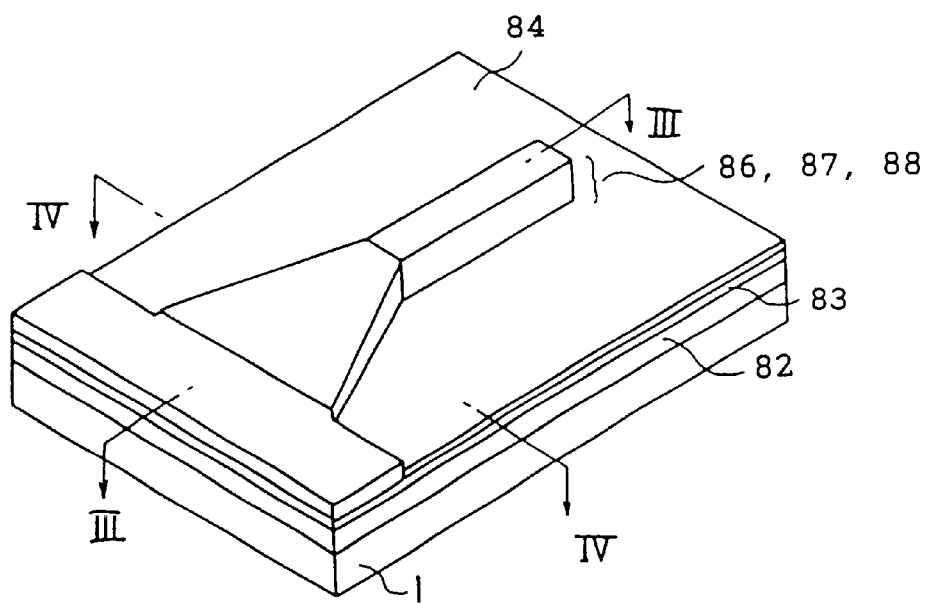

Next, as shown in FIG. 25B and FIG. 26A that shows a sectional view taken along a line III—III shown in FIG. 25, an n-InP cladding layer 82, a first SCH layer 83 composed of $In_xGa_{1-x}As_yP_{1-y}$ (0<x<1, 0<y<1), an MQW layer 86, a second SCH layer 87 composed of $In_xGa_{1-x}As_yP_{1-y}$, and a p-InP cladding layer 88 are grown epitaxially on an n-type InP substrate 81 exposed from the first mask 84 continuously. As to the film thickness of respective layers, the n-InP cladding layer 82 is grown in the thickness of 100 nm, the first and the second SCH layers 83 and 87 are grown in the thickness of 100 nm, and the p-InP cladding layer 88 is grown in the thickness of 200 nm.

Crystals of these layers are not grown on the mask 84 having no growth nucleus, but are grown selectively on the n-type InP substrate 81 located in the opening portion 85 of the mask 84. Moreover, in these layers, the film thickness is the thickest in the stripe-shaped gain region 79 of the opening portion 85 of the mask 84, and the film thickness gets smaller as becoming more distant from the gain region 79 in the mode converting region 80 spreading therefrom. Such a method of growing a film is called a selective area growth method.

The thickness of well layers 86a of the MQW layer 86 at the bottom end portion of the mode converting region 80 shows ⅓ of the film thickness in the gain region 79. This MQW layer 86 functions as an active layer in the gain region 79, and serves as a waveguide in the mode converting region 80. Since the MQW layer 86 is formed in a tapered shape in the mode converting region 80, that region is also called a tapered region hereinafter.

The MQW layer 86 is structured of three well layers 86a composed of $In_xGa_{1-x}As_yP_{1-y}$ (0<x'<1, 0<y'<1) and barrier layers 86b composed of $In_{x"}Ga_{1-x"}As_{y"}P_{1-y"}$ (0<x"<1, 0<y"<1) put therebetween, and the thickness of the well layer 86a is 7 nm and the thickness of the barrier layer 86b is 15 nm in the gain region 79, respectively.

After the above-mentioned first mask 84 is removed, a second mask 89 is formed on a p-InP cladding layer 88 along the light travelling direction as shown in FIG. 27A showing a sectional view taken along a line IV—IV in FIG. 25B. The mask 89 is obtained by applying patterning to a silicon nitride film thereby to form it in a rectangular stripe shape 1.5 μm in width. At this time, the beam spot is formed in a circle shape or in an almost circle shape with the ratio of the minimum values of the stripe widths in the gain region 79 and the mode converting region 80 set to 0.8 to 1.2.

Thereafter, the p-InP cladding layer 88 to the upper part of the n-InP cladding layer 82 are shaped by etching in an almost perpendicular direction using the second mask 89 as shown in FIG. 27B. Then, a first p-InP buried layer 90 and an n-InP buried layer 91 are formed one after another on the n-InP cladding layer 82 located on both sides of the second mask 89 as shown in FIG. 27C, without removing the second mask 89.

Next, after the second mask 89 is removed, p-InP is laminated on the p-InP cladding layer 88 and the n-InP buried layer 91, thereby to increase the thickness of the second cladding layer 88 and also to form a second p-InP buried layer 92 on the n-InP buried layer 91 so as to form a current blocking layer 93 having a. thyristor construction on both sides of the MQW layer 86. Furthermore, p+ type InGaAsP is laminated on p-InP as shown in FIG. 26B, which is used as a contact layer 94. This contact layer 94 is made not to exist in the tapered region 90 either by using a mask for preventing crystal growth or by applying patterning to the semiconductor layer.

Thereafter, an insulating film 95 is formed on the contact layer 94, and an opening portion 96 is formed only above the MQW layer 86 of the gain region 79 by applying patterning to the insulating film 95 by photo-lithography.

After completing lamination of compound semiconductor in this manner, a p-side electrode 97 is formed on the contact layer 94 and an n-side electrode 98 is formed on the under surface of the n-InP substrate 81 as shown in FIG. 26C. Furthermore, both side faces of the InP substrate 81 and the semiconductor layers formed on the substrate 81 are cleaved. Besides, a reflecting film may also be formed on the cleaved surface of the gain region 79.

FIG. 24 shows a perspective view in which a Fabry-Pérot semiconductor laser formed in the process as described above is partly cut out. Since the taper configuration in the mode converting region 80 of the MQW layer of this semiconductor laser is obtained by arranging the shape of the mask, which is used for growing a film, without changing the etching process, crystal defects become more difficult to be produced in the MQW layer in a tapered form. As a result, deterioration of characteristics by crystal defects becomes no longer produced in this layer. Moreover, the taper configuration is formed with small error and high yield, thus making it possible to obtain beam spots having a uniform configuration.

Figure 28A:
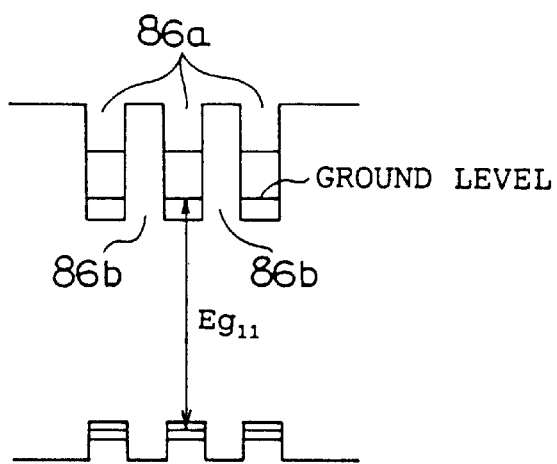
FIG. 28A and FIG. 28B are diagrams each showing an energy band of a quantum well construction in the seventh optical semiconductor device according to an embodiment of the present invention.
Figure 28B:
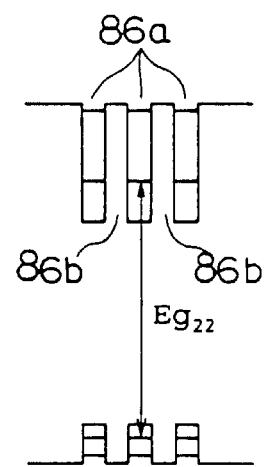

In the MQW 86 of this semiconductor laser, the light which has oscillated in the gain region 79 resonances with the reflection from the end face of the gain region 79 and the end face of the mode converting region 80 and is outputted from the end face on the side of the mode converting region 80. In this case, the potential at the ground level of the quantum well becomes larger as a well layer 86a gets thinner by a quantum size effect, and the band gap between the conductive band and the valence band of the well is also expanded. Since a band gap $Eg_{11}$ in the gain region 79 shown in FIG. 28A is smaller than a band gap $Eg_{2\ 2}$ in the mode converting region 80 shown in FIG. 28B, the MQW layer 86 in the gain region 79 transmits the light oscillated in the gain region 79.

Since the variation of the film thickness of the MQW layer 86 in the tapered region 80 is gentle, however, a part in the MQW layer 86 in a tapered MQW layer 86 that is near the gain region 79 becomes a saturable absorption layer. When a saturable absorption layer is in existence, the light is absorbed until the layer is saturated by the carriers. Therefore, the threshold gets higher and a kink is produced along a optical output vs. current characteristic (I-L characteristic) curve, thus making sufficient light intensity no longer obtainable.

Figure 29:
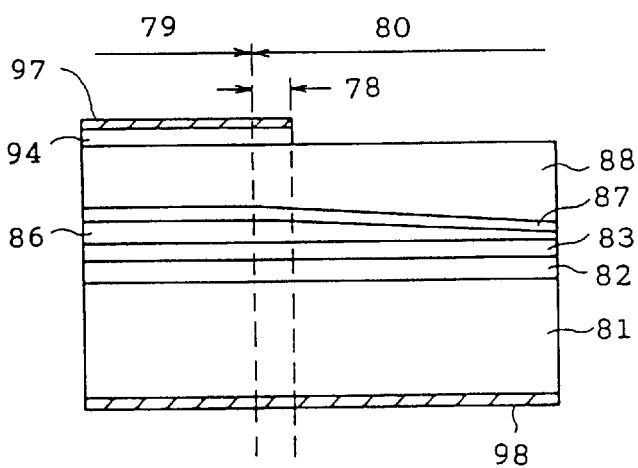
FIG. 29 is a sectional view showing a preferable configuration of a p-side electrode in the seventh optical semiconductor device according to an embodiment of the present invention.

Thus, as shown in FIG. 29, it is preferable to form such a structure that a p-side electrode 97 formed in the gain region 79 of the semiconductor laser is extended to a saturable absorption region 78 in the vicinity of the tapered region 80, and a current is also injected into the MQW layer 86 of the saturable absorption region 78.

According to such a structure, a current is also injected to the MQW layer 86 of the saturable absorption region 78 through an electrode 97, and the MQW layer 86, in which light absorption in that region is offset by injection of carriers, does not become a saturable absorption layer, but becomes transparent and transmits the light. With this, a kink is no longer produced along a threshold ascent characteristic curve, thus obtaining a characteristic such as shown in FIG. 30.

According to the L-I characteristic curve shown in FIG. 30, a value of a threshold current of 19 Ma which is lower than that in the constructions shown in citations [3] and [4] has been obtained with an element of double cleavage and a differential quantum efficiency was as excellent as 0.25 Mw/Ma. Further, since the optical absorption wavelength edge is shifted toward the shorter wavelength side than the oscillation wavelength and almost no saturable absorption region is generated in the mode converting region 80, neither hysteresis nor kink is generated along the L-I curve, and it has been confirmed that reflector or radiation of light at the junction portion of the active region 79 and the tapered region 80 in the MQW layer 86 is controlled sufficiently low.

Further, as the result of observation of a far field pattern, it has been found that the full width at half maximum (FWHM) of an output beam is 11.8° in the film thickness (horizontal) direction and 8.0° in the facial (vertical) direction of the film as shown in FIGS. 31A and 31B, thus obtaining a beam output angle narrower than before.

Figure 32:
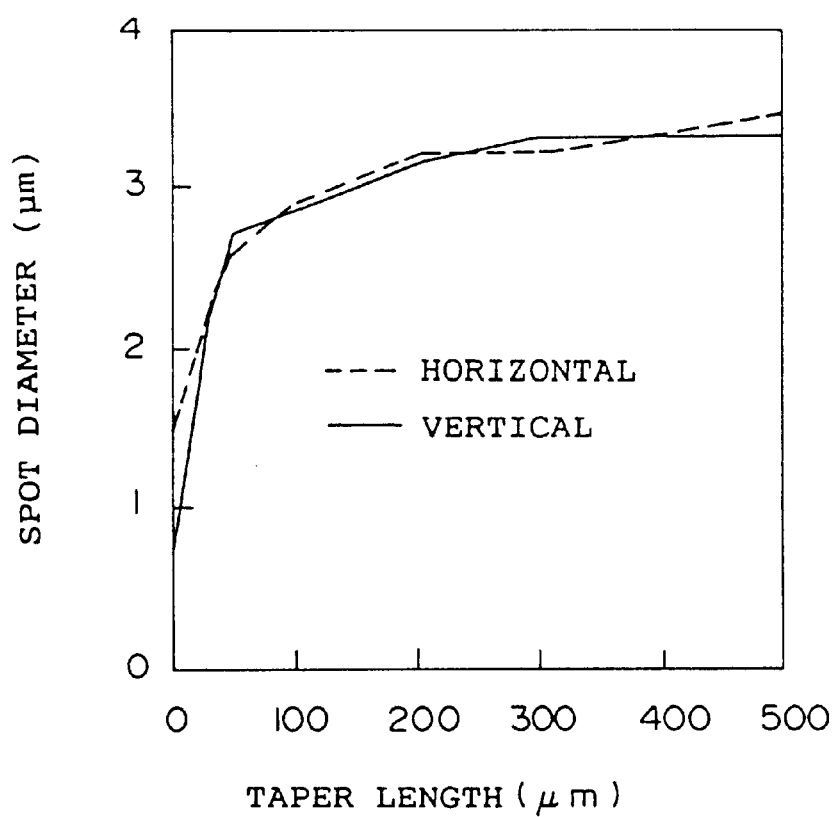
FIG. 32 is a characteristic diagram showing the relationship between the taper length and a spot diameter of a near field pattern of the seventh optical semiconductor device according to an embodiment of the present invention.

Further, when the relationship between the beam spot diameters in a vertical direction and a horizontal direction and the length (taper length) of the tapered region 80 in a near field pattern was investigated, the relationship such as shown in FIG. 32 has been obtained. In this case, the thickness of the well layer 86a of the MQW layer 86 in the tapered region 80 was set to ⅕ of the thickness of the well layer 86a in the gain region 79.

In FIG. 32, the mode of the light cannot follow the change of the film thickness and sufficient functions as a mode converter is unobtainable when the length where the film thickness is changed suddenly, i.e., the taper length is 50 μm or less. As against the above, the change of film thickness which is sufficient as a mode converter is shown when the taper length is 50 μm or more even if the change of the spot diameter is gentle. Further, although it is not illustrated in particular, no change is noticed in the spot diameter when the taper length reaches 500 μm or more, and the length longer than the above becomes unnecessary in particular.

Accordingly, it may safely be said that the optimum taper length is 50 μm or more and preferably 50 to 500 μm. When the ratio of the film thickness at a start bottom end to that an end bottom end of the tapered region of the MQW layer 86 is two times or more, a function as a mode converter is obtainable.

Next, an optimum magnitude of the change of the MQW layer 86 in the mode converting region B will be described.

Figure 33:
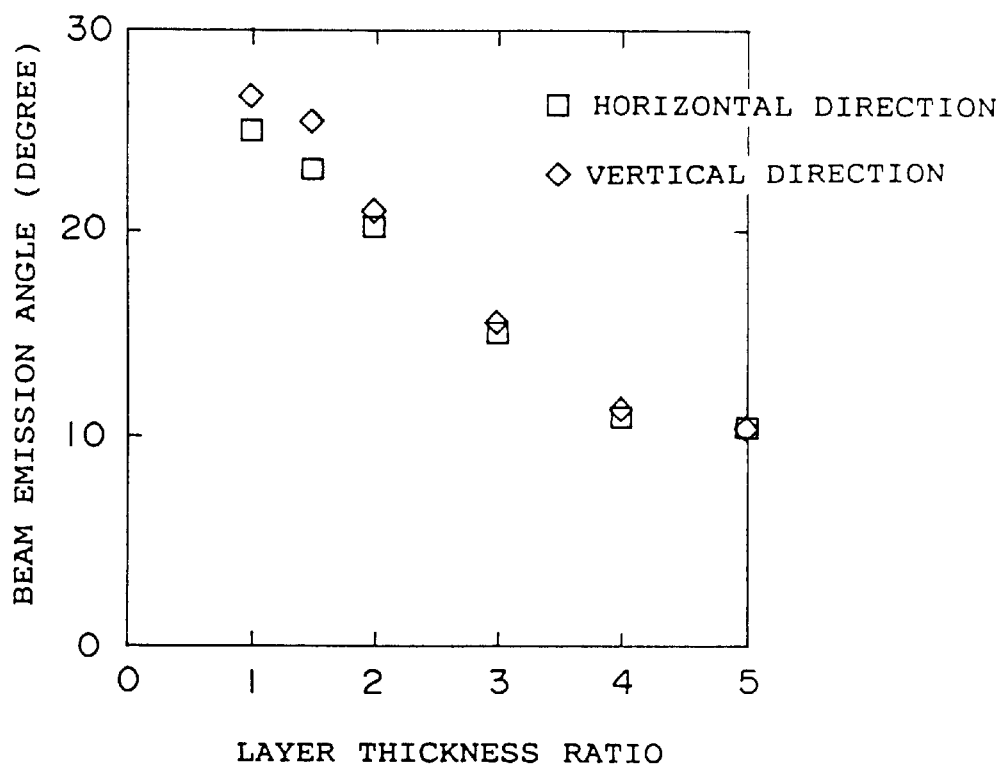
FIG. 33 is a characteristic diagram showing the relationship between a film thickness ratio and a beam output angle of an optical semiconductor device according to a seventh embodiment of the present invention.

FIG. 33 shows a result of calculating how the beam output angle from the output end is changed when the film thickness ratio between the input end and the output end (input end film thickness/output end film thickness) of the mode converting region 80 of the MQW layer 86 that becomes the tapered waveguide is changed from 1 to 5.

Figure 34:
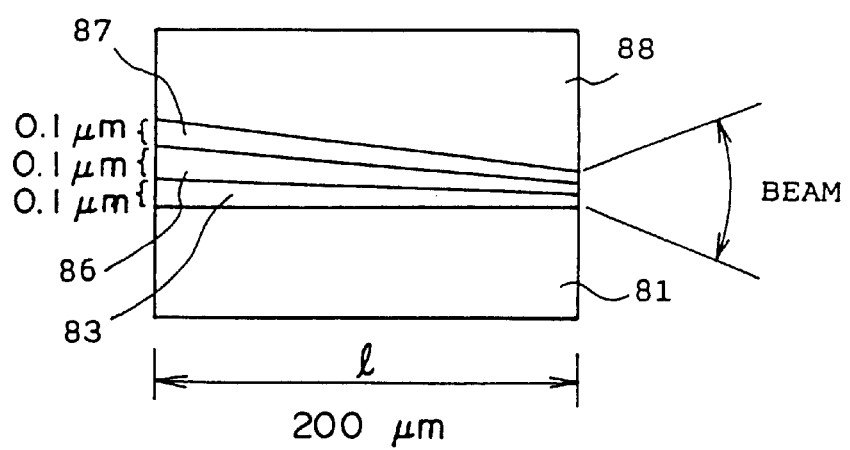
FIG. 34 is a sectional view showing a model of the waveguide used when the characteristic shown in FIG. 33 is computed.

A normal three-dimensional beam propagation method is used for computation, which has been made on an MQW waveguide of a 1.3 μm band. As shown in FIG. 34, the film thickness of the MQW layer 86 at the input end is set to 0.1 μm, the thickness of the SCH layers 83 and 87 is set to 0.1 μm, and the length l of the waveguide is set to 200 μm, and a loss-less waveguide in that the change of the film thickness is uniform has been assumed. The lateral width of the tapered waveguide was set constant at 1 μm over the whole length of the waveguide.

In FIG. 33, a square dot shows an emission angle of a beam in a horizontal direction with respect to the substrate surface, and a rhombic dot shows an emission angle of a beam in a vertical direction with respect to the substrate surface. According to FIG. 33, only an emission angle close to 30 degree is obtainable similarly to a general semiconductor laser when the film thickness ratio is set to 1.

The emission angle is narrowed as the film thickness ratio becomes larger, and the angle reaches 15 degrees and 12 degrees when the film thickness ratio is 3 and 4, respectively. Further, the fact that the values of emission angles in the horizontal direction and the vertical direction draw near shows that the beam configuration gets near a circle, and a desirable result for the coupling with an optical fiber is obtained as getting nearer to a circle.

When coupling with an optical fiber is considered, it is when the beam output angles both in the horizontal and vertical directions become half of or less than the past, i.e., 15 degrees or less that a large improvement in the coupling efficiency is made.

The foregoing corresponds to a case that the film thickness ratio is 3 or higher. Accordingly, when a mode converter (a spot size converter) is used, it is apparent from FIG. 33 that the film thickness ratio of the MQW layer 86 is preferably 3 or higher. However, even when the emission angle is 20 degrees, i.e., the film thickness ratio is 2, the effect of improvement of the coupling efficiency by the fact that the beam gets nearer to a circle than a conventional laser and the mode configuration of the laser gets near the mode configuration of the optical fiber can be expected.

Now, an optical modulator integrated light source in that the film thickness of the MQW layer is changed has been set forth in Japanese Patent Provisional Publication No. 1-319986 and Japanese Patent Provisional Publication No. 3-284891.

In the former publication, it is described to change the film thickness of the MQW layer at the boundary between the gain region and the modulation region by changing the width of a mesa-stripe shape of the substrate. Further, in the latter publication, it is described to change the film thickness of the MQW layer at the boundary between the gain region and the modulation region by changing the stripe width of the mask. In these publications, the film thickness in the modulation region of the MQW layer is formed constant, and neither any description nor suggestion is given with respect to the formation of the MQW layer into a tapered shape.

In a light source where the optical modulator is integrated, the MQW layer of the optical modulation region is structured of a composition of a shorter wavelength as compared with the composition of the MQW layer of the gain region. For example, when the composition of the gain region is 1.3 μm, the composition of 1.20 μm to 1.22 μm is formed in the optical modulation region. Besides, when the composition of the gain region is set to 1.5 μm, it is set to approximately 1.40 μm to 1.45 μm in the optical modulation region.

When the above figure is converted into the film thickness ratio of the MQW layer, the film thickness ratio falls within the range of 1.5 to 2. When the composition is formed at the film thickness ratio larger than the above, sufficient light absorption becomes unachievable unless the voltage for optical modulation is increased since the composition wavelength in the optical modulation region is too high. As a result, the working voltage of elements has to be raised. Practically, the film thickness of the MQW layer in the gain region of the optical modulator integrated light source described in those patent provisional publications is two times or less of the film thickness of the MQW layer of the optical modulation region.

Accordingly, in a light source where the optical modulator is integrated, it is desirable that the change of the film thickness of the MQW layer is smaller, and it differs from an effective change quantity of the film thickness of the semiconductor laser in that the mode converter of the present invention is integrated.

As described above, it has been found by the present inventor et al. that the effective ranges of the change of the film thickness are different between an optical modulator integrated light source and an optical mode converter integrated light source, and, in the light source where the mode converter is integrated, it is required to make the film thickness of the waveguide layer of the mode converter two times or more at the input end against the output end, and a circular beam is obtainable by making the film thickness five times.

Figure 35:
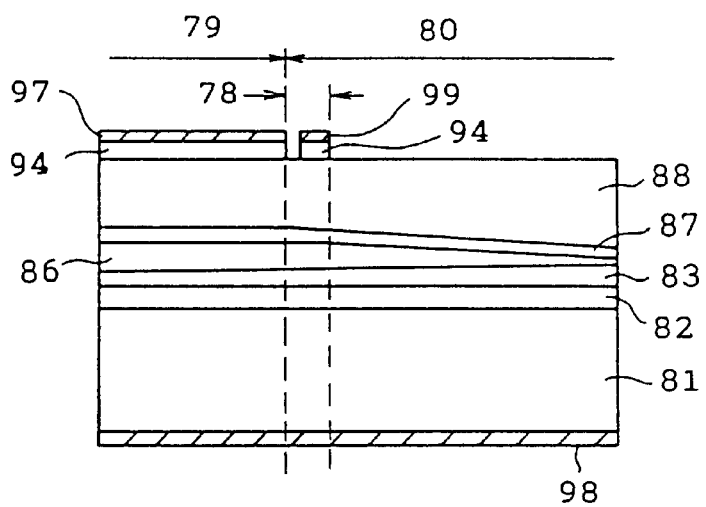
FIG. 35 and FIG. 36 are sectional views showing variation in arrangement of an electrode of the seventh optical semiconductor device according to an embodiment of the present invention.

As described above, the function as a mode converter is obtainable by making the film thickness ratio between the starting bottom end and the end bottom end of the tapered region of the MQW layer 86 larger than two times. Further, the change of the film thickness needs not to be uniform, but the film thickness may change suddenly in the vicinity of the gain region 79 and change gently as becoming more distant therefrom, or conversely may change gently in the vicinity of the gain region 79, or the rate of change of the film thickness may be changed gently a plurality of times. Further, the film thickness thereof may also be changed gently stepwise. Now, when a current injected into the saturable absorption region 78 may be smaller than that into the gain region 79, two p-side electrodes 97 and 99 may be formed separately in the gain region 79 and the saturable absorption region 78 as shown in FIG. 35. With this, a current injection quantity in the saturable absorption region 78 becomes less and power consumption is reduced.

Figure 36:
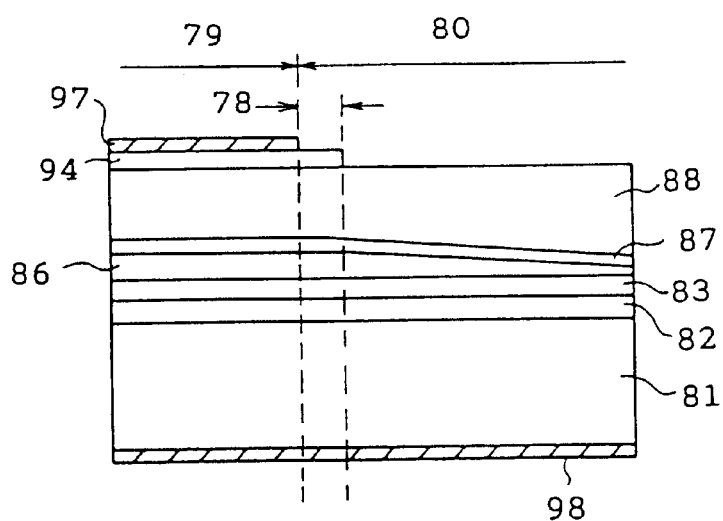

Furthermore, since the light absorption quantity in the saturable absorption region 78 of the tapered MQW layer 86 gets smaller gradually as becoming more distant from the gain region 79, a smaller current value for eliminating optical absorption will suffice as becoming more distant from the gain region 79. Accordingly, it is sufficient to extend, not the p-side electrode, the contact layer 94 only from the gain region 79 to the saturable region 78 as shown in FIG. 36. According to the foregoing, the contact layer 94 composed of an impurity containing semiconductor has a higher resistance than a metal made p-side electrode 97, and a current injected into the MQW layer 86 through the contact layer 94 gets smaller as becoming more distant from the gain region 79. Hence, it is possible to control supply of an excessive current.

A Fabry-Pérot construction has been adopted in the present embodiment, but a DBR laser construction may also be adopted by providing a diffraction grating above or below the MQW layer 86 of the mode converting region 80. Further, a diffraction grating may be provided along the MQW layer of the gain region so as to obtain a DFB laser construction. Further, the MQW is structured with an InGaAsP/InP or InGaAs/InP group material in the above-mentioned embodiment, but an MQW formed of an GaAs/AlGaAs or AlGaAs/AlGaAs group material, an GaInP/AlGaInP or Al GaInP/AlGaInP group material or other compound semiconductor materials may also be used.

Besides, the growth of the compound semiconductor layer is performed by MOCVD, MBE or other epitaxial growth methods.

What is claimed is:

1. A method of manufacturing an optical semiconductor device comprising the steps of:

forming a dielectric film on a semiconductor substrate;

forming a window by opening a long and narrow active element forming region and an almost fan-shaped waveguide forming region connected to at least one end portion of said active element forming region in said dielectric film and in that a width of said opening gets wider as becoming more distant from said end portion by applying patterning to said dielectric film;

forming a first cladding layer, a core layer and a second layer having a film thickness that is the thickest in said active element forming region and the film thickness gets thinner as becoming more distant from said active element forming region in said waveguide forming region continuously by growing a semiconductor selectively on said semiconductor substrate exposed from said window of said dielectric film;

forming a first electrode under said semiconductor substrate; and forming a second electrode at least in said active element forming region of said second cladding layer.

2. A method of manufacturing an optical semiconductor device according to claim 1, wherein said core layer has a quantum well layer.

3. A method of manufacturing an optical semiconductor device according to claim 1, wherein, in a portion of said waveguide forming region in said window of said dielectric film, a width thereof spreads into a fan shape.

4. A method of manufacturing an optical semiconductor device according to claim 1, wherein, in a portion of said waveguide forming region in said window of said dielectric film; a width spreads in a step form.

5. A method of manufacturing an optical semiconductor device comprising the steps of:

forming a dielectric film on a semiconductor substrate;

forming a window by opening a long and narrow active element forming region and an almost fan-shaped waveguide forming region connected to at least one end portion of said active element forming region in said dielectric film and in that a width of said opening becomes wider as becoming more distant from said end portion by applying patterning to said dielectric film;

forming a first cladding layer, core layer and a second cladding layer having a film thickness that is a thickest in said active element forming region and the film thickness gets thinner as becoming more distant from said active element forming region continuously by growing a semiconductor selectively on said semiconductor substrate exposed from said window of said dielectric film;

forming a recessed portion by means of removing a part of said first cladding layer, said core layer and said second cladding layer located in said active element forming region by etching;

forming a waveguide type optical active element by growing a semiconductor in said recessed portion; and forming a first electrode under a semiconductor substrate, and forming a second electrode on said waveguide type optical active element.

6. A method of manufacturing an optical semiconductor device according to claim 5, wherein said core layer has a quantum well layer.

7. A method of manufacturing an optical semiconductor device according to claim 5, wherein, in the portion of said waveguide forming region in said window of said dielectric film, a width thereof spreads into a fan shape.

8. A method of manufacturing an optical semiconductor device according to claim 5, wherein, in a portion of said waveguide forming region in said window of said dielectric film, a width spreads into a step form.

* * * * *